United States Patent [19]

Hong et al.

[11] 3,906,485

[45] Sept. 16, 1975

[54] DATA CODING CIRCUITS FOR ENCODED WAVEFORM WITH CONSTRAINED CHARGE ACCUMULATION

[75] Inventors: Se J. Hong; Daniel L. Ostapko, both of Poughkeepsie, N.Y.

[73] Assignee: IBM Corporation, Armonk, N.Y.

[22] Filed: June 13, 1973

[21] Appl. No.: 369,675

[52] U.S. Cl. ............................ 340/347 DD; 178/68

[51] Int. Cl.² ........................................ H03K 13/24

[58] Field of Search... 340/347 DD, 172.5, 174.1 G; 178/68

[56] References Cited

UNITED STATES PATENTS

| | | | |
|---|---|---|---|
| 3,369,229 | 2/1968 | Dorros | 340/347 DD |
| 3,374,475 | 3/1968 | Gabor | 340/347 DD |
| 3,587,088 | 6/1971 | Franaszek | 340/347 DD |
| 3,587,090 | 6/1971 | Labeyrie et al. | 340/347 DD |
| 3,629,823 | 12/1971 | Czernikowski | 340/347 DD |
| 3,631,471 | 12/1971 | Griffiths | 340/347 DD |
| 3,647,964 | 3/1972 | Tang | 178/68 |
| 3,689,899 | 9/1972 | Franaszek | 340/172.5 |
| 3,691,553 | 9/1972 | McIntosh | 340/347 DD |
| 3,716,851 | 2/1973 | Neumann | 340/347 DD |

FOREIGN PATENTS OR APPLICATIONS

| | | | |
|---|---|---|---|
| 1,155,050 | 6/1969 | United Kingdom | 340/174.1 G |

OTHER PUBLICATIONS

"IBM Technical Disclosure Bulletin," Chapman et al., April 1973, pp. 3413–3414, Vol. 15, No. 11.

"IBM Technical Disclosure Bulletin," Tang, Vol. 11, No. 12 May 1969, pp. 1623–1624.

"IBM Technical Disclosure Bulletin," Bossen et al., Vol. 14, No. 8, Jan. 1972, pp. 2535–2536.

"IBM Journal of Research & Development," Franaszek, July 1970, pp. 376–383.

*Primary Examiner*—Charles D. Miller
*Attorney, Agent, or Firm*—William S. Robertson

[57] ABSTRACT

The encoding circuits of this invention provide signals for representing binary data in a storage medium or in a transmission system as a waveform that has a small constrained value of accumulated difference between its positive and negative portions. The waveform has minimum and maximum run lengths between transitions between positive and negative values so that it provides both high density and good clocking. Several new codes are described which can be implemented with fewer logic and storage components than prior codes of this general type.

10 Claims, 17 Drawing Figures

DATA CODING CIRCUITS FOR ENCODED WAVEFORM WITH CONSTRAINED CHARGE ACCUMULATION

RELATED APPLICATIONS

This invention relates to further developments in data coding apparatus of the type disclosed in application Ser. No. 317,980 of Arvind M. Patel filed Dec. 26, 1972, for "Data Coding with Stable Base Line For Recording and Transmitting Binary Data" now U.S. Pat. No. 3,810,111. The application of Patel has background information that is useful in understanding this invention.

BACKGROUND

The following definitions provide a general introduction to the objects and advantages of this invention and will be helpful for understanding the specific embodiments of the invention that will be described later.

Data Bit, Message — A data bit is an elemental unit of data that is supplied by an associated system to the encoding circuit of this invention and is supplied by the decoding circuit of this invention to an associated system. A sequence of data bits of definite or indefinite length forms a unit of data called a "message."

Bit Pair, Encoded Bit — In coding circuits of this general type, a data bit is encoded as a "bit pair" such as 10, 01, 11 or 00. A bit of a bit pair will be called a "code bit."

Encoded Waveform — The code bits produced by the encoder of this invention is represented by a waveform that varies between two signal levels. Typically, the waveform varies in voltage between a predetermined positive voltage and a predetermined negative voltage.

Direct, Indirect Codes — The encoded waveform represents the code bits according to various known schemes. The familiar representation of a binary 1 by a positive voltage level and a binary 0 by a negative level is called a "direct code." A code that represents a binary 1 by a transition from positive to negative or from negative to positive levels and represents a binary 0 by the absence of such a transtition is called an "indirect code." This invention relates to both direct codes and indirect codes.

Bit Time, Clocking Circuit — In the encoded waveform a particular time interval or a particular length of storage medium contains the signal levels that represent two code bits (a bit pair) which represent the corresponding single data bit. Such an interval will be called a "bit time." The waveform contains information which aids clocking circuits to identify each bit time.

Window Unit — Since each bit time carries the signal for a code bit pair, a bit time has two intervals that represent the two code bits of a bit pair. These intervals are called "window units."

Charge — In entirely arbitrary patterns of coded 1 and 0 data bits, the waveform can contain sequences that have significantly more pulses of one polarity than of the other polarity. Thus, the waveform contains a direct component that certain types of devices cannot transmit. For example, the effect occurs in capacitor coupled circuits in which the capacitor gradually charges with the direct component of the waveform and cannot then transmit the alternating component of the waveform. From the terminology of this familiar problem, this adverse effect is called "charge accumulation" or "charge." Charge accumulation has a polarity: it is either plus or minus if it is not zero, but for most physical devices the polarity is not significant and can be ignored in codes of the type to which this invention relates.

Run Length — The maximum number of window units between transitions in the waveform is called the "run length." Since the clocking circuits respond only to these transitions, an object of these codes is to limit the run length to a value that is satisfactory for the clocking circuits.

(R,C) Code — The terms R and C designate respectively the run length and the maximum charge accumulation of a code. As an example of this terminology, the (6,3) code that will be described later has a maximum run length of 6 window units and a maximum accumulated charge that corresponds to 3 window units of charge. The codes all have a minimum run length of 2 window units and this is not expressed in the code designation.

SUMMARY OF THE INVENTION

This invention provides new encoding and decoding circuits for several (4,3) indirect codes. A theoretical explanation will be represented to show that the code first proposed by Patel is one of a class of several (4,3) indirect codes. Some of the new codes have the advantage that their coding and decoding circuits are simplified or are simpler to implement in a particular circuit technology. All codes of this class require storage for encoding a data bit as a function of adjacent data bits and decoding a code bit pair as a function of adjacent code bit pairs, and a more specific object of this invention is to provide new and improved codes and circuits for encoding and decoding that require only a few bit positions of storage.

The invention also relates to codes with relaxed constraints that fullfill the practical requirements of a wide range of applications. A new (6,3) direct code and also a new (5,3) indirect code permit substantially simplified coding circuits and provide only slightly reduced clocking ability.

The encoding and decoding circuits of this invention are preferably embodied in an array logic device. An array logic device has an array of logic elements that selectively interconnect row input lines and column output lines to form a particular logic function. Complex logical functions can be formed from truth tables or from optimized truth tables without directly generating the logic equations that are commonly used with discrete logic components. The circuits of this invention can also be implemented in discrete logic components, as will be explained in detail.

THE DRAWINGS

THE TABLES

Table 1 is a truth table for the encoding of the (6,3) direct code of this invention.

Table 2 shows coded and decoded signals for identifying charge states in the coding circuits for the (6,3) direct code circuits.

Table 3 is a development from the truth table of Table 1 showing circuit connection in an array logic encoder for the (6,3) direct code.

Table 4 is a truth table for the decoder circuit for the (6,3) direct code.

Table 5 is a development of the truth table of Table 4 showing the logical connections in an array logic decoder for the (6,3) direct code.

Table 6 is a matrix equation describing (4,3) indirect codes.

Table 7 is a listing of solutions of the equation of Table 6 for which there are useful (4,3) indirect codes.

Figure 7:
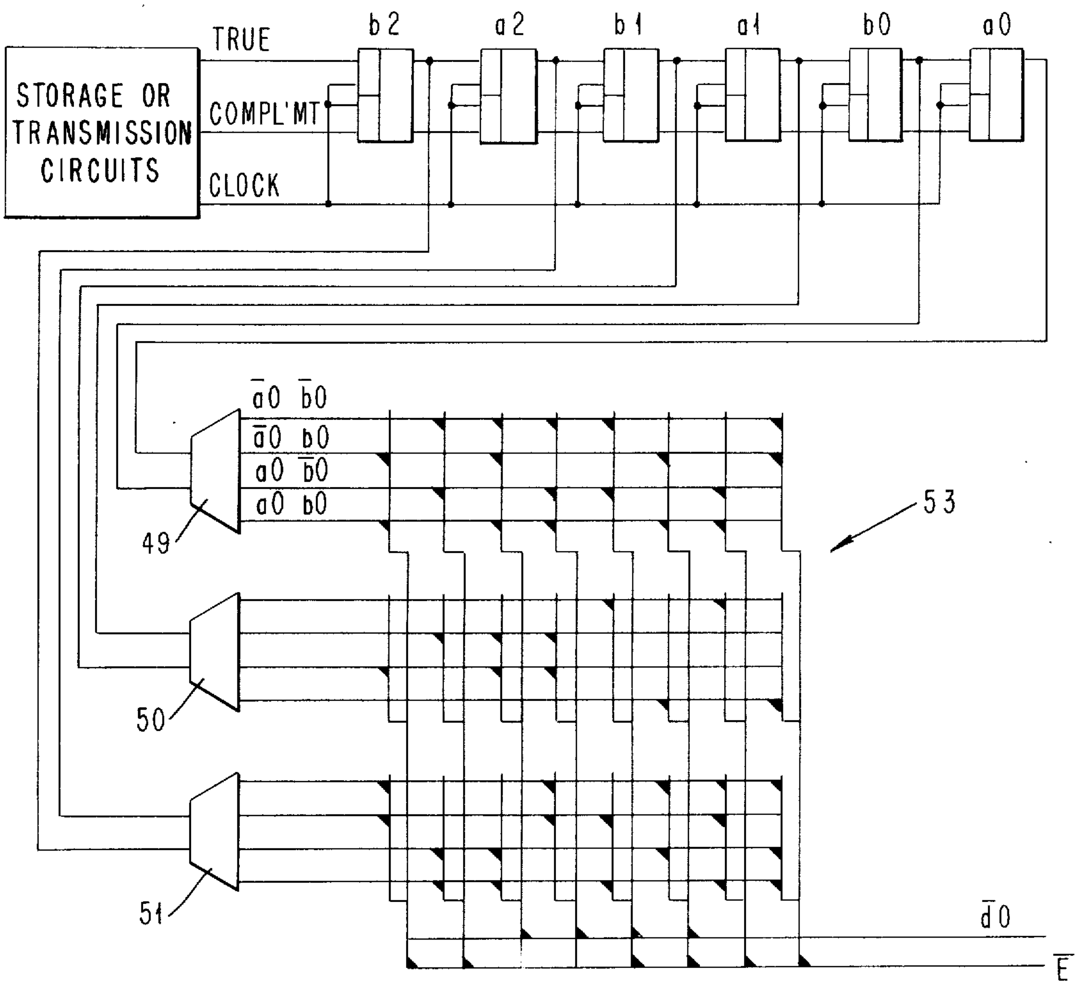
FIG. 7 is a schematic diagram of the decoder circuit for the (6,3) direct code.
Figure 8:
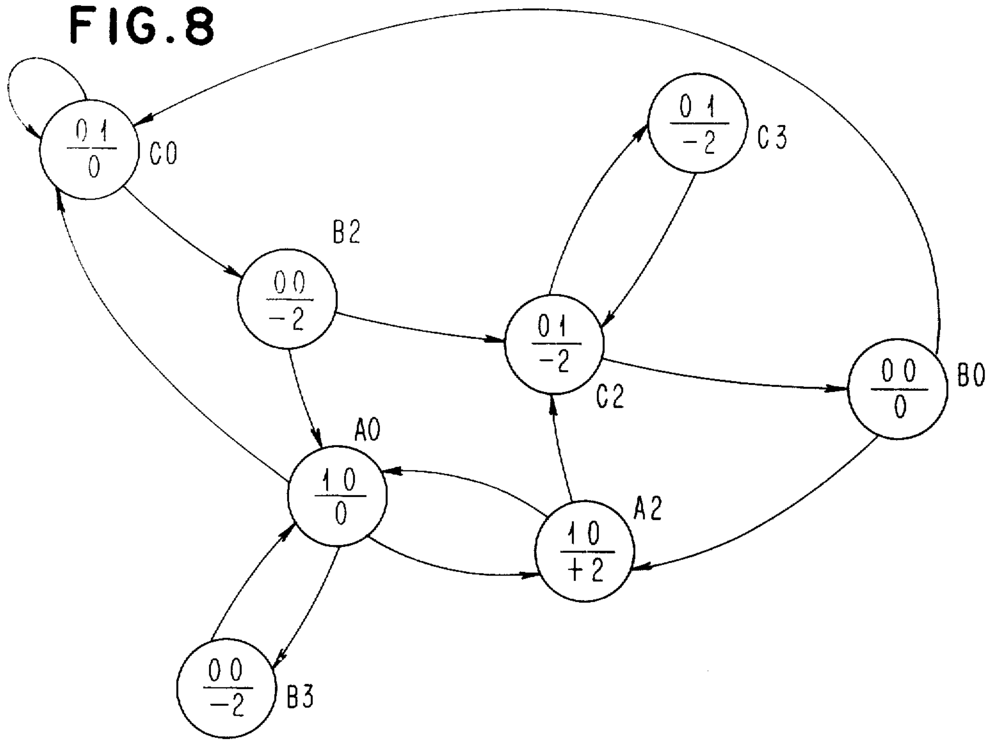
FIG. 8 is a state diagram for a (4,3) indirect code.

Table 8 shows the assignment of a three bit code to charge states in the diagrams of FIGS. 7 and 8.

Figure 9:
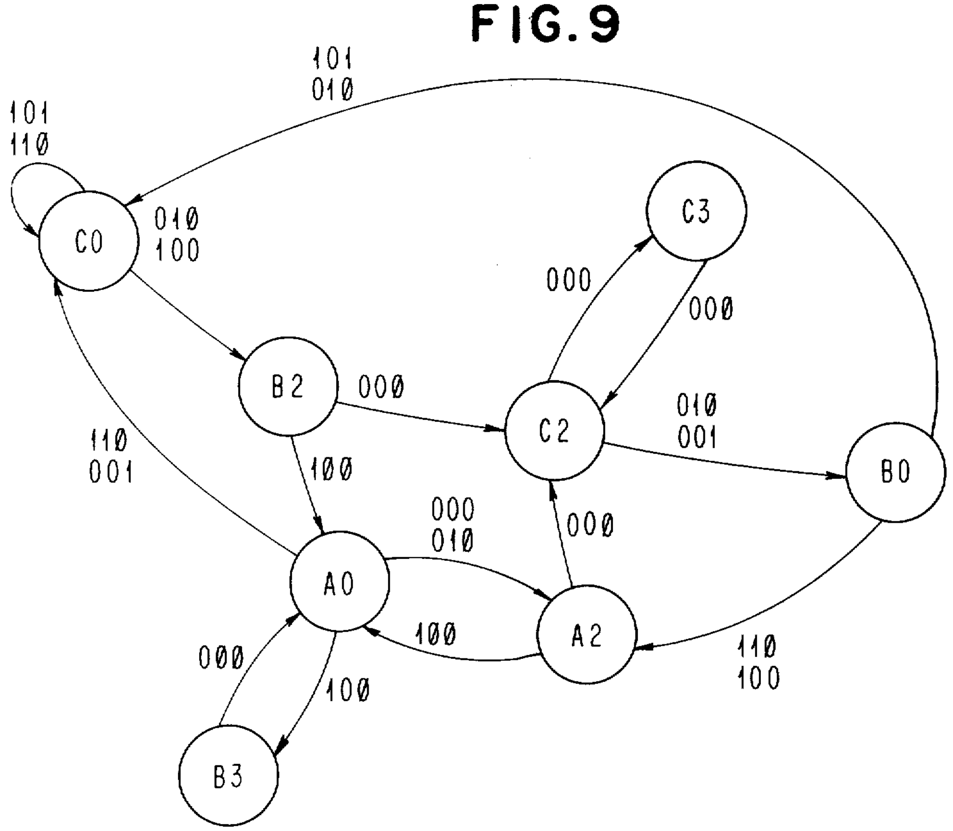
FIG. 9 is a state diagram for the alpha (4,3) indirect code of this invention.

Table 9 is a truth table for the encoder circuit of FIG. 9 for the alpha (4,3) indirect code.

Figure 10:
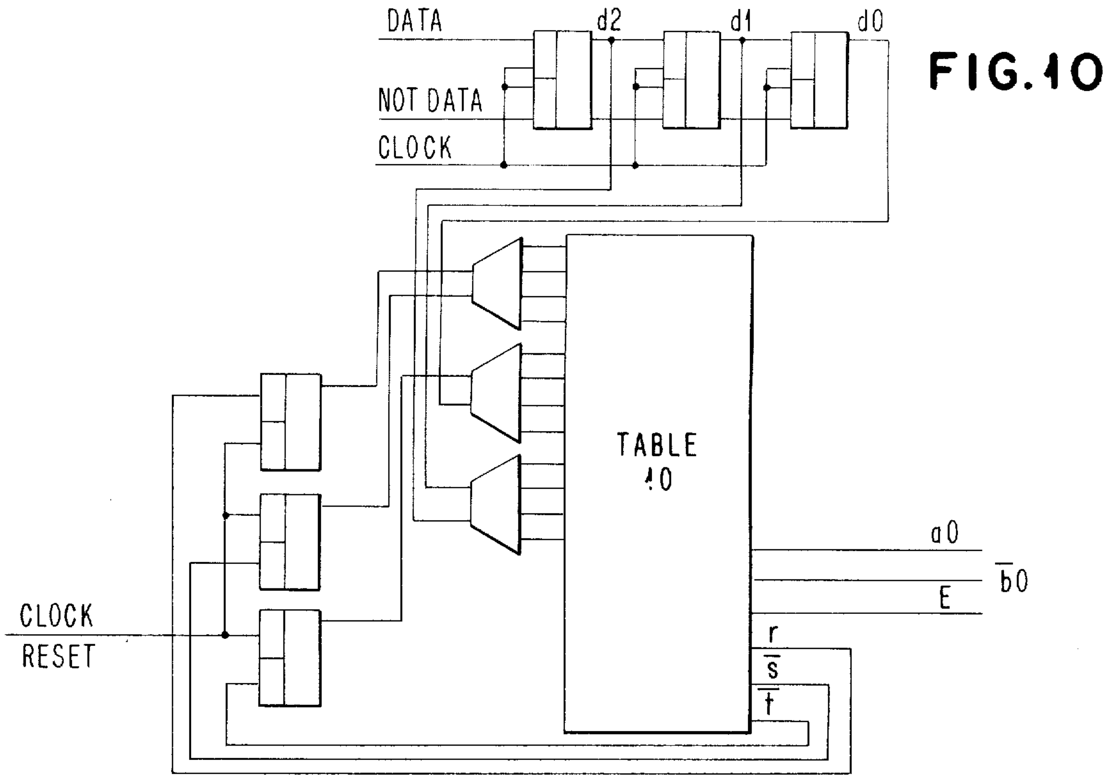
FIG. 10 is a schematic diagram of an encoder circuit for the alpha (4,3) indirect code.

Table 10 shows the array logic connections of the alpha (4,3) indirect code encoder of FIG. 10.

Table 11 is a truth table for decoder circuit for the alpha (4,3) indirect code.

Figure 11:
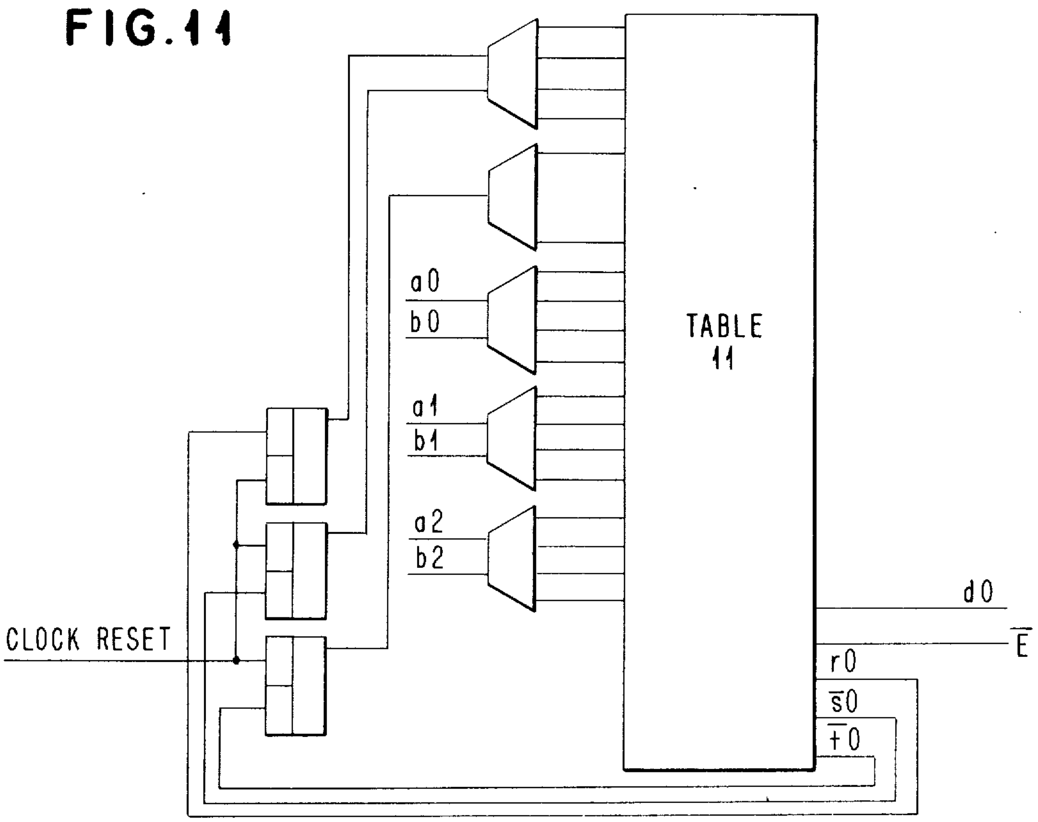
FIG. 11 is a schematic diagram of a decoder circuit for the alpha (4,3) indirect code.

Table 12 shows the array logic connections for the decoder circuit of FIG. 11.

Table 13 is a truth table for the encoder for the beta (4,3) indirect code.

Figure 13:
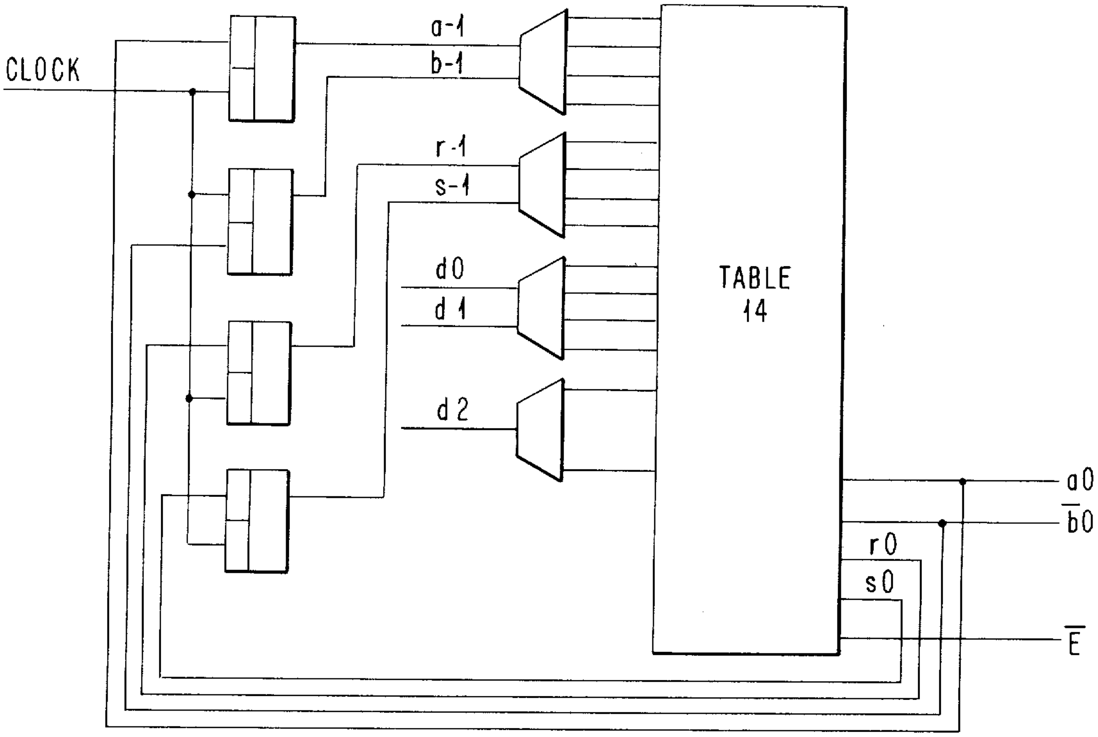
FIG. 13 is a schematic diagram of an encoder for the beta (4,3) indirect code.

Table 14 shows the array logic connections for the encoder circuit of FIG. 13.

Table 15 is a truth table for a decoder for the beta (4,3) indirect code.

Figure 14:
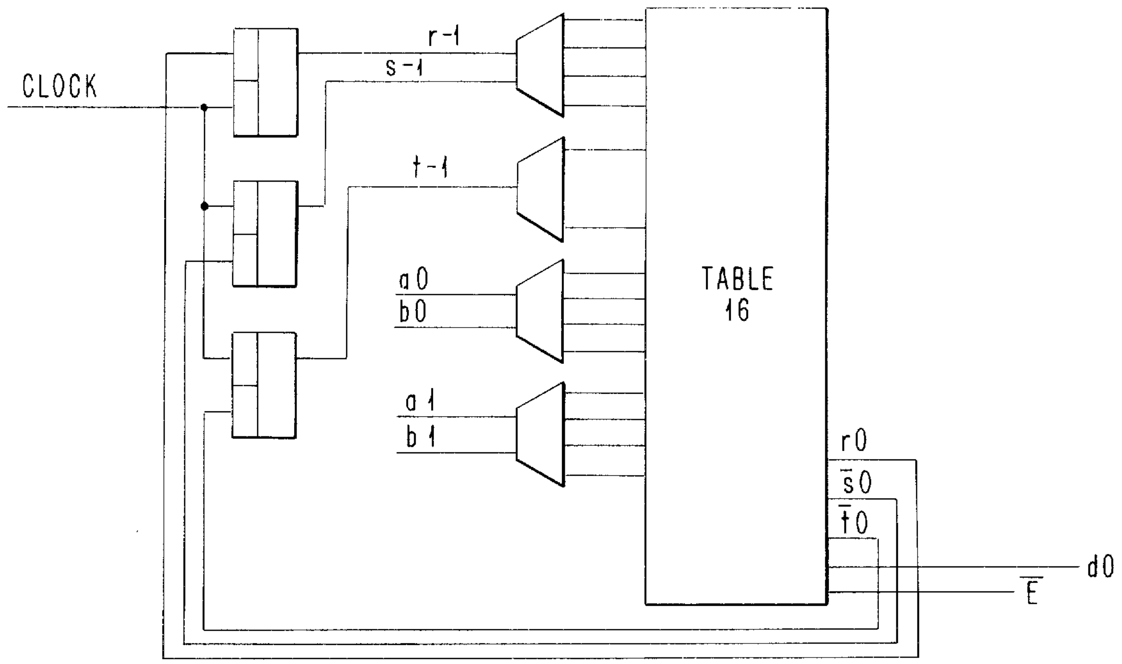
FIG. 14 is a schematic diagram of a decoder for the beta (4,3) indirect code of this invention.

Table 16 shows the array logic connections for the decoder of FIG. 14.

Table 17 is a truth table for the encoder for the (5,3) indirect code.

Figure 16:
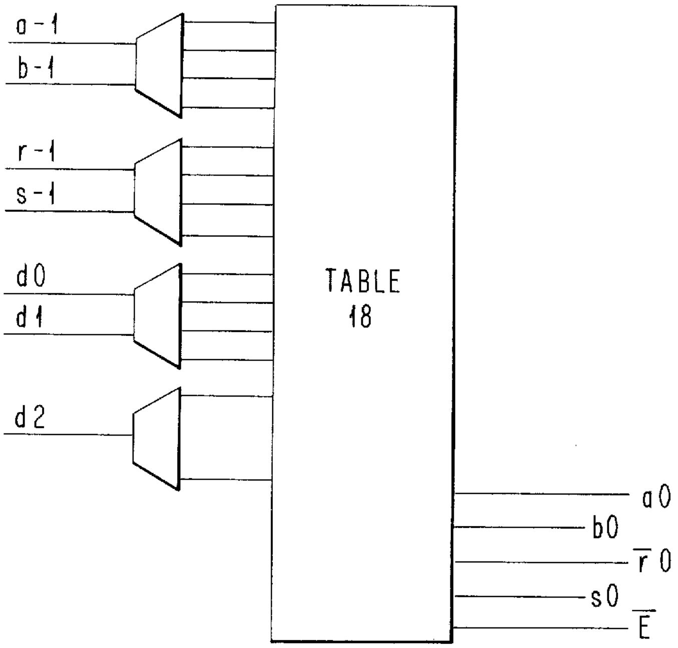
FIG. 16 is a schematic diagram of an encoder for the (5,3) indirect code.

Table 18 shows the array logic connections for the encoder of FIG. 16.

Table 19 is a truth table for the decoder for the (5,3) indirect code.

Figure 17:
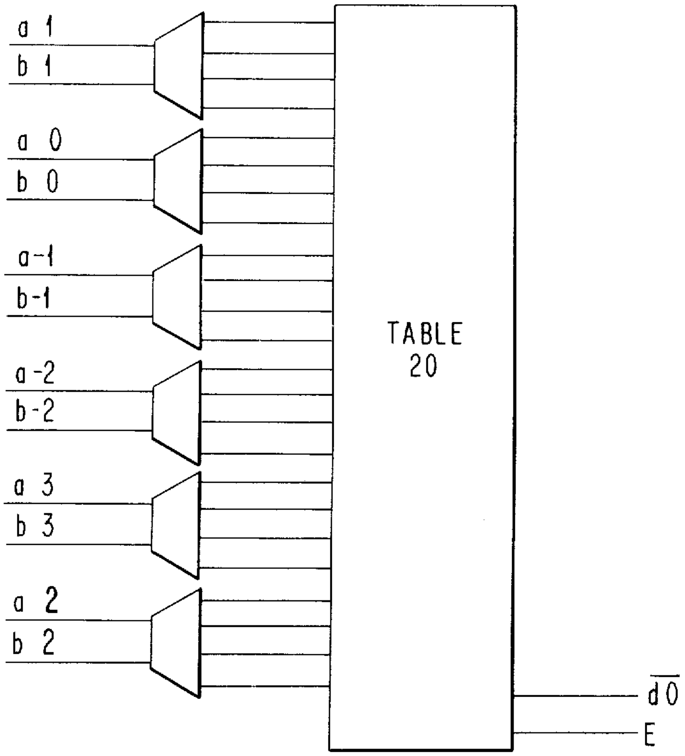
FIG. 17 is a schematic diagram of a decoder for the (5,3) indirect code.

Table 20 shows the array logic connections for the decoder circuit of FIG. 17.

The (6,3) Direct Code

Figure 1:
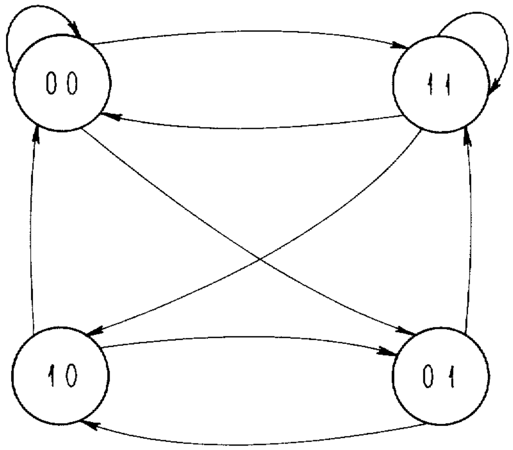
FIG. 1 is a diagram representing sequences of bit pairs in a (6,3) direct code of this invention.
Figure 2:
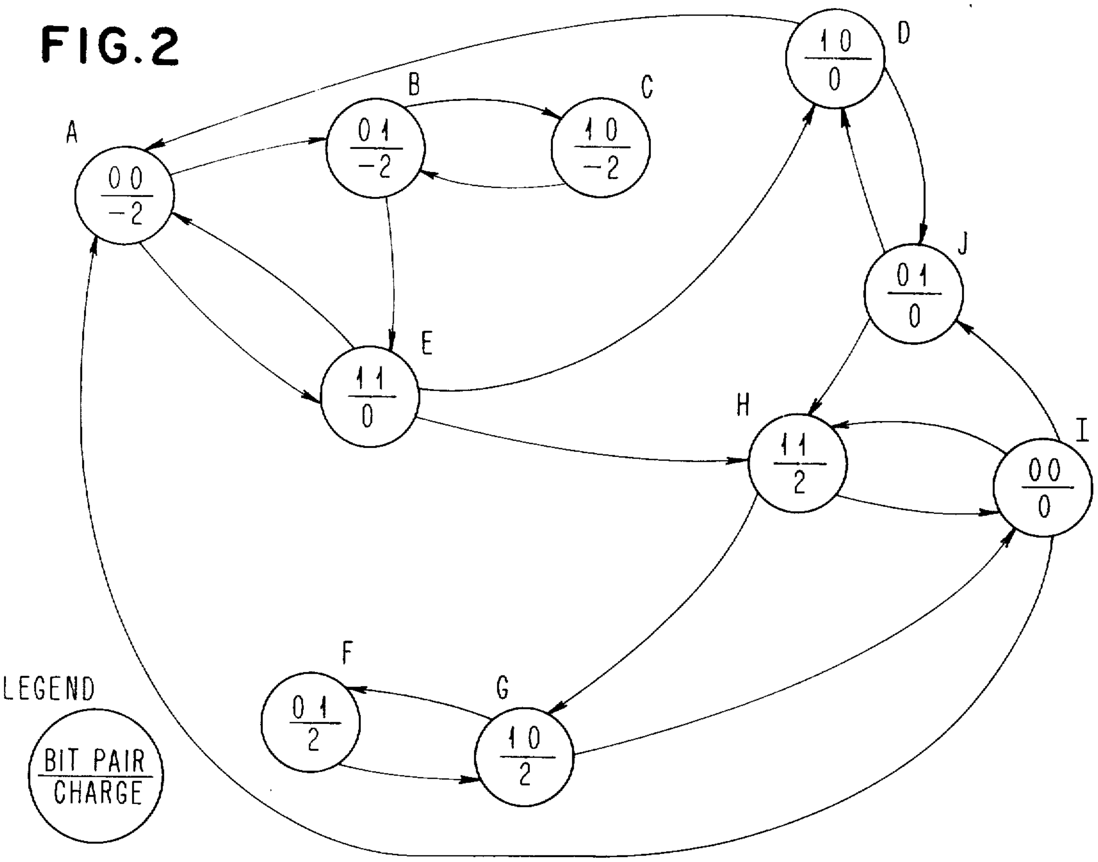
FIG. 2 is a development of the diagram of FIG. 1 to show the charge states associated with the bit pairs.

The Diagrams of FIGS. 1 and 2

FIG. 1 shows the four possible code bit pairs enclosed in circles with arrows showing the permitted transitions from one bit pair to a next bit pair. One of the constraints of these codes is that no run length is shorter than two window units. Thus, in the diagram of FIG. 1, transitions such as 00 to 10 are not used because the isolated 1 code bit of this example would produce a positive pulse of a single window unit in width. To meet a constraint that the run length is not more than 6, the transition 00 to 00 and 11 to 11 are not permitted more than once.

FIG. 2 is similar to FIG. 1 except that the bit pairs of FIG. 1 are shown in the upper half of each circle and the lower half of each circle shows the charge value that results from the encoding operation. Thus, there are additional states in FIG. 2 representing combinations of code bit pairs and permitted values of charge accumulation. The permitted charge values at the end of a bit time are −2, 0 and +2; (the maximum value permitted by the code designation, ±3, occurs only between the two code bits of a pair). Thus, for example, state D represents an encoding operation that produces the bit pair 10 and leaves the waveform at 0 charge accumulation. It is also possible for the operation encoding the bit pair 10 to produce accumulative charge of −2 or +2 units, shown for states C and G in FIG. 2. A circuit can be constructed to encode and decode data according to the charge states and bit pairs of FIG. 2 if any sequence of data bits can be represented by transitions from one state to another. Thus, for example, state D, which has been introduced already, has transitions to two other states, A and J, so that when the encoding operation is in state D, the next data bit can be encoded as a 00 or a 01 without violating the charge or frequency constraints. It can be seen that two of the states, E and I, each have three exits to other states and that two of the states, C and F, have only a single exit. As will be explained next, transitions through single exit states are combined with transitions through triple exit states to produce an operable coding circuit.

Figure 3:
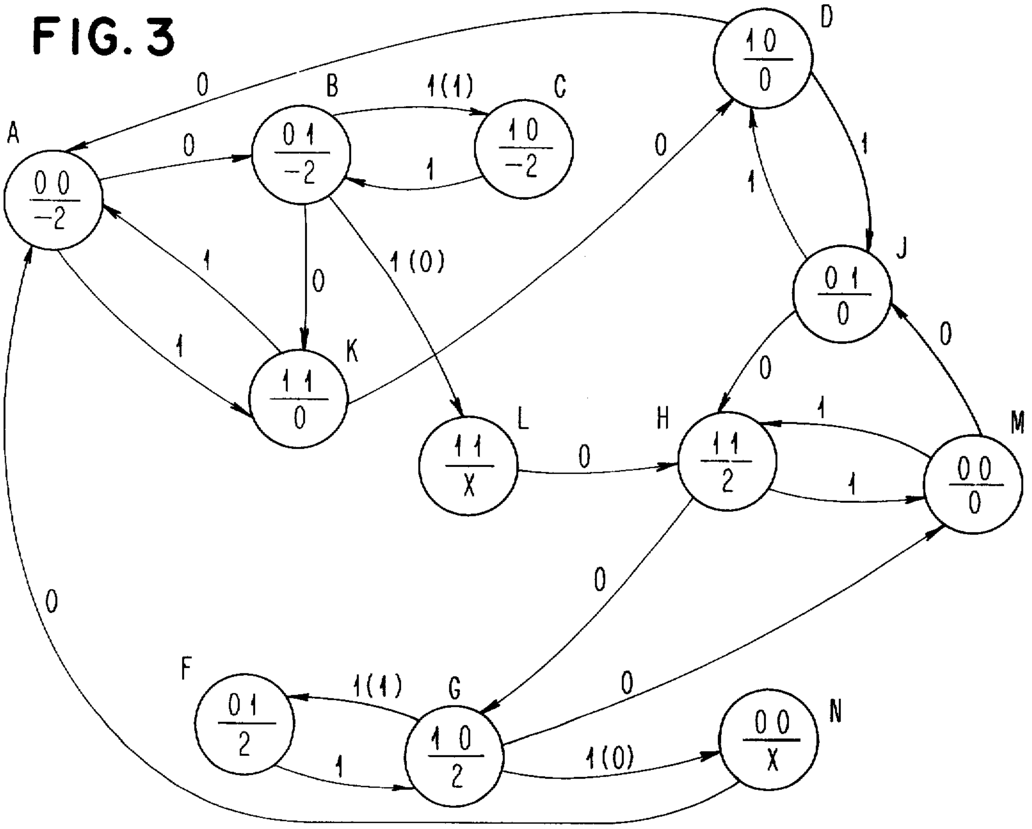
FIG. 3 is a development of the diagram of FIG. 2 that permits data bit significance to be attached to transitions from one charge state to another.

The diagram of FIG. 3

FIG. 3 is closely similar to FIG. 2 except that binary digits have been assigned to each of the transitions and the charge states have been modified to better illustrate the encoding operation. As an example of the data assignments, when the circuit is in state D, a 0 digit is encoded as 00 and the encoding operation produces a transition to state A and a 1 digit is encoded as a 01 and this encoding operation produces a transition to state J.

State E in the diagram of FIG. 2 has been replaced by two states designated K and L. Both states K and L of course represent the same code bit pair and charge state as state E which they replace, but for state L the charge state is designated X. State K has the transitions of state E between states A, B, and D but not the transition of state E to state H. State L has the transition from state B to state E to state H. Thus, state K has two exits for encoding either a 0 digit or a 1 digit and is used in the same fashion as other states with two exits. State L is used in encoding the data bit sequence 10 and thus provides a complement path to the transition from state B to state C to state B for encoding the data sequence 11. In FIG. 3, a data bit that must follow the data bit being encoded is shown in parenthesis on the transition line.

Similarly, state I in FIG. 2 has been replaced by two states M and N. State M preserves two of the exits of state I and its charge state is designated 0, the same as state I. State N represents the third exit of state I to state A and cooperates with state G for encoding the data sequence 10 from state G. This sequence of states is complementary to the transition G to F to G which is used for encoding the data sequence 11.

Table I

Table I is a truth table representing in the left hand columns the input conditions for an encoding operation in FIG. 3 and in the right hand column the results of an encoding operation. The code bit pairs are designated "*a*" and "*b*" with subscripts to designate the position in the sequence; *a*0 is the code bit being encoded or decoded, *a*1 is the next code bit and *a*-1 is the previous code bit. Similarly, "*d*" with a subscript represents a data bit. The columns for *a*-1, *b*-1, *d*0 and *d*1 in the input columns correspond directly to the terms in FIG. 3. Thus, for example, the first row identifies the previously encoded bit pair as 00 and the data bit to be encoded as a 0 and thus corresponds to a transition in the set A to B, M to J, and N to A in FIG. 3. The three charge values and the X charge state are represented in a 2 bit code as shown in Table 2. These binary values are designated "*r*" and "*s*." Table 2 also shows a four bit decoded value of the two bit code that will be used in identifying charge states in the circuit of FIG. 4.

Thus, for example in row 1, the entry *r*-1, *s*-1 = 00 identifies the charge value as 0 and the input entry in the first row of Table 1 can be seen to define a transition from state M to state J for which a data digit 0 is to be encoded as a digit pair *a*0, *b*0 = 01. The output column identifies *a*0, *b*0 = 01 and identifies that the new charge value is 0, which is encoded as 00. The 0 in the rightmost column headed "E" (for Error) signifies that the transition is shown in FIG. 3 where each transition meets the constraints of the code. A 1 in the Error column identifies an invalid transition. Such an error may occur because of a failure in the circuits that will be described later, or the circuit may be operated to produce an invalid code. Invalid codes may be used for various purposes such as synchronization, as explained in the application of Patel.

Figure 4:
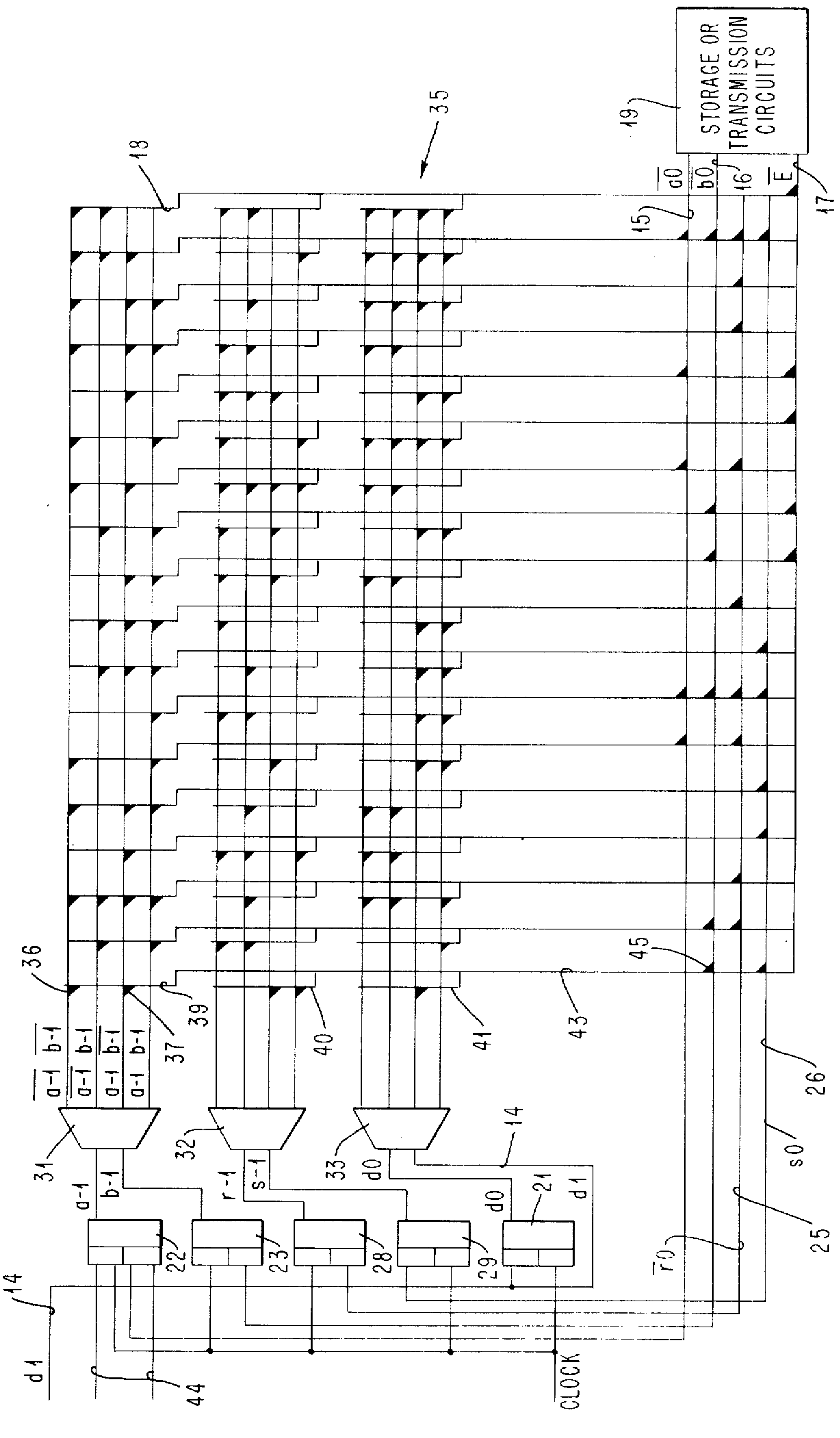
FIG. 4 is a schematic diagram of an encoder circuit for the (6,3) direct code of this invention.

The Encoder Circuit of FIG. 4

The circuit of FIG. 4 receives a sequence of data bits on a line 14 and produces as outputs on lines 15, 16, 17 the coded bit pair *a*0, *b*0 and the Error signal E. (For particular output functions, the complement is formed because it is simpler to implement in the logic circuit; the complements can be inverted by a single logic circuit.) These signals are applied to recording or transmitting circuit 19 that converts the parallel input *a*0, *b*0 to a serial sequence and applies the resulting waveform to a recording medium such as a magnetic tape or to a data transmission system. Circuit 19 may respond to error signal 17 in various known ways. As Table 1 shows, the encoding operation for this code requires both the bit to be encoded, *d*0, and the next bit to be encoded, *d*1. The data bit on line 14 is stored in a latch 21 for one bit time. The output of latch 21 is the data bit to be encoded, *d*0, and the data bit on line 14 is the next bit to be encoded, *d*1. (As is conventional in encoding circuits, the user of the encoder circuit supplies the clocking signals that are associated with the data bits to be encoded and these signals control latch 21 and other components of FIG. 4 by conventional circuit arrangements that are not shown in the drawing.) Similarly, latches 22, 23 receive the signals $\overline{a0}$, $\overline{b0}$, on lines 15, 16 and produce the signals *a*-1, *b*-1, which are required by the truth table of Table 1. The circuit also produces the charge state signals $\overline{r0}$, *s*0 on lines 25, 26, and latches 28, 29 produce the signals *r*-1 and *s*-1 as required by Table 1. Thus, the signal on line 14 and the outputs of latches 21, 22, 23, 28, 29, correspond to the inputs of the truth table of Table 1. The remaining components of FIG. 4 operate on these outputs according to the logic function of Table 1.

Figures 5, 6:
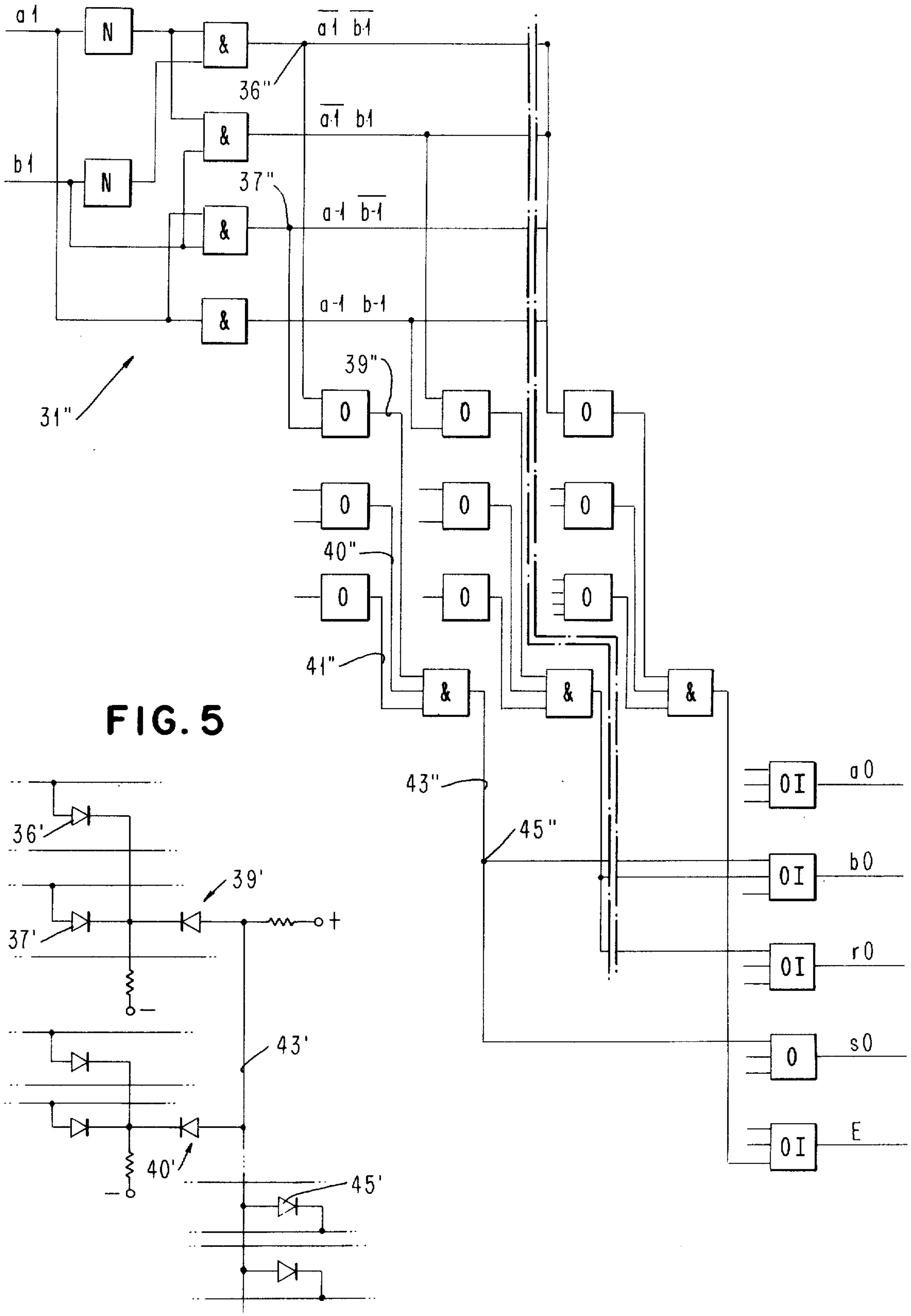
FIG. 5 is a schematic diagram of circuit components of the array logic circuit of the encoder of FIG. 4.
FIG. 6 is a schematic diagram of a discrete logic circuit that is a counterpart of the encoder circuit of FIG. 4.

There are various circuit techniques for performing logic functions that are expressed in truth tables. The preferred encoder uses the array logic device of FIG. 4; (FIG. 6 shows an equivalent logic circuit formed of discrete logic components). In the circuit of FIG. 4, a decoder circuit 31 receives the signals *a*-1, *b*-1 and produces a 1 logic level signal on one of four output lines to identify the AND logic function of the two input variables. (Note that a decoder 31 and a decoder such as FIG. 7, described later, are similar in a generic sense but they are to be distinguished as to their function and structure in this description.) The order of the outputs from top to bottom corresponds to a simple binary counting sequence, as legends on these lines in FIG. 4 show. For example, the first row in Table 1 states that both *a*-1 and *b*-1 are 0, in other words, the function Not *a*-1 AND Not *b*-1 = 1; when this condition appears at the inputs to decoder 31, a 1 logic level signal appears on the upper most output line of decoder 31 and 0 logic level signals appear on the other three output lines of the decoder. (A conventional circuit implementation for this logic function is shown in FIG. 6.) A decoder 32 similarly receives the inputs *r*-1, *s*-1 and energizes one of four output lines according to the AND function of these two variables. A decoder 33 similarly decodes variables *d*0 and *d*1.

Table 3 is equivalent to Table 1 except that the input column headings of Table 3 correspond to the outputs of decoder circuits 31, 32, 33 whereas the corresponding columns in Table 1 correspond to the inputs to these decoder circuits and except that the logic function has been simplified by using Boolean algebra logic minimization techniques to reduce the number of rows in the table and to reduce correspondingly the number of column lines in the array logic circuit. The output column headings for Table 3 are identical to the output column headings for Table 1 except that for certain of the outputs the complement values are formed, as already explained.

The circuit of FIG. 4 includes an array 35 of logic elements that interconnect row and column wires. An element 36 schematically represents an OR logic function between row lines and column lines. Conventionally, as FIG. 5 shows, these elements are diodes 36' that transmit a logic signal from a row line to a column line but prevent unintended connections from the column lines back to the row lines. To continue the example, elements 36 and 37 connect two of the outputs of decoder 31 to a column line 39 so that a 1 logic level signal appears on line 39 whenever a 1 logic level signal appears on either of these two outputs from decoder 31. Thus, these elements form the logic function Not *a*-1 AND Not *b*-1 OR *a*-1 AND Not *b*-1 on line 39. (This function simplifies to Not *b*-1.)

The outputs of decoders 32 and 33 are similarly connected to the column lines such as 40 and 41 in an OR logic function. These column lines are connected in an AND logic function to a column line that is shown closely to the right in FIG. 4. To continue the previous example, lines 39, 40 and 41 are each connected to an associated column line 43 to form an AND logic function on line 43. Circuit elements such as elements 45 connect the column lines to selected ones of the row output lines. FIG. 5 shows a diode logic circuit with the components of FIG. 4 identified by the same reference character with a distinguishing prime. Other suitable components for the array logic circuit are well known.

To summarize, the columns in FIG. 4 from left to right correspond to the rows in Table 3 from top to bottom and the row lines from top to bottom correspond to the columns in Table 3 so that for each 1 or 0 bit in Table 3 there is an intersection of row and column wires in array 35. For each 1 bit in the input section of the table there is a connection (36, 37) at the corresponding intersection point, and for each 0 bit there is an absence of such a connection. For each 1 bit in the output section of the table there is a connection 45 at the corresponding intersection of the column lines and the row output lines and for each 0 bit there is an absence of such a connection at the corresponding intersection.

It will be recognized that arrays can be implemented in a variety of components and that the form of the logic expression may be varied to accommodate the logic operation that is provided by these selected components. It should also be apparent that a truth table can be implemented directly in array logic, or, as is more common, the truth table can be minimized so as to reduce the number of columns required in the array. The truth table can also be embodied in discrete logic components, as FIG. 6 shows. FIG. 6 corresponds closely to array 35 of FIG. 4, and corresponding components have the same reference character with a double prime. (The outputs in FIG. 6 differ from the corresponding outputs in FIG. 4 by having the invert function that has been described already.) Various routines are well known for designing logic circuits from a truth table.

The latches in FIG. 4 also have inputs 44 for setting the latches to predetermined values for setting the circuit to an initial value or for generating error outputs. (Similar inputs for other encoder circuits of this invention are not expressly shown in the drawing.)

The (6,3) Direct Decoder

The truth table for this decoder is shown in Table 4 and a minimization of the logic function is shown in Table 5. The relationship of the two tables will be evident from their column headings and the detailed description of the corresponding tables for the encoder. As the column headings show, the decoder requires the code bit pair *a*0, *b*0 for the bit to be decoded, *d*0, and the code bit pairs for the next two bits to be decoded, *d*1 and *d*2. In the decoder of FIG. 7, a six bit shift register receives the code bits and suitable clocking signals from circuits of the storage or transmission system using the code. Clock signals provided by the source of data to be encoded are applied to the latches, as representative inputs in the drawing show, to shift data through the latches so that when a particular bit appears at a latch input, the preceding bit appears at the output. (The latches also operate to invert some bits where the complement bit appears at the encoder output.) Decoders 49, 50, 51 apply the shift register outputs to an array 53 that is constructed according to Table 5 to produce the decoded data bit, $\overline{d0}$, and an error signal $\overline{E}$. Again note the complementary form of some signals which can be inverted if necessary by simple inverter circuits to yield the true phase signals.

(4,3) Indirect Codes

Introduction

With an indirect code, the constraint that the run length is at least two window units is achieved by avoiding adjacent 1 bits in the code. Thus, the code does not use the bit pair 11 or the bit pair sequence 01–10. The constraint that the maximum run length is four window units is achieved by limiting the maximum sequence of 0 code bits to 3.

FIG. 8 is a diagram of sequences of bit pairs that are permitted within the charge and run length constraints of the (4,3) indirect code. As in the case of the (6,3) direct code, certain of the states have only one entrance and one exit and thus limit the use of these sequences for coding. To better understand the possibilities of developing codes from the diagram of FIG. 8, we have developed the concept of a distinguishability index, which will be discussed next.

The Distinguishability Index

If each state had two exits, a code could be generated simply by designating one exit from each state for data bit 1 and the other exit for data bit 0. In the description of the (6,3) direct code, states with a single exit were combined with states with three exits to provide paths for all possible data sequences. To consider this from a more general viewpoint, a state that has two exits can be thought of as having one exit for coding sequences of data digits beginning with 0 and another exit for coding sequences of data digits beginning with a 1; where a state has three exits, one can be thought of as encoding sequences that begin with 0 and the other two exits can be thought of as encoding sequences that begin 10 and 11. Such sequences will be written with the character "$\phi$" to show that a bit can be either a 1 or a 0; thus, the sequence 10$\phi$ requires only that the first two bits of the sequence are 10 and the next bit can be either a 1 or a 0.

The "distinguishability index" is a measure of the extent to which all possible data sequences can be encoded. A distinguishability index of 2 means that all possible data sequences can be encoded from the state. If such a state has two exits in the simplest data assignment one of them can be used for encoding the data sequence 0$\phi$ and the other exit can be used for encoding the data sequence 1$\phi$. Similarly, a distinguishability index of 1 signifies that the transitions from the state can be used for encoding only half of the possible data sequences. In the simplest situation, such a transition might be used for encoding a 1 data bit but 0 data bits would be uncodeable. (From a more general standpoint, each transition can be assigned data sequences of various lengths representing the available portion of the possible data sequences.)

A code is developed by finding paths in the state diagram to permit encoding all possible sequences of data bits. From the discussion so far, it should be apparent that the distinguishability index of a particular state depends on the distinguishability index of its successor states: the states that have a single exit not only limit the data sequences from such a state but also may limit the sequences that lead to these states. Thus, the distinguishability index of a particular state is one half the sum of the distinguishability indexes of its immediate successor states. Considering only the immediate successor states, a set of equations can be written to describe the distinguishability index of each of the states of FIG. 8. For example, state C0 has two successor states, C0 and B2, and the distinguishability index, DI, can be written as DI (C0) = ½[DI (C0) + DI (B2)]. This relationship can be expressed more simply as C0 − B0 = 0. The equations for each state of FIG. 7 can be derived similarly and are listed in Table 6.

Table 7 shows solutions of this equation which are useful in these codes. The table shows a general solution for which the distinguishability index is a function of a variable designated *a*. A practical code must have at least one state with a distinguishability index of 2 for use as a starting point for encoding any possible data sequence. For most circuit devices, it will be desirable that this starting state also be a state of zero charge. Thus, the actual values of the distinguishability index in Table 7 are established by these considerations. Several codes that are based on Table 7 can now be readily understood.

The Alpha (4,3) Indirect Code

Introduction — FIG. 9

FIG. 9 shows the transitions between charge states of FIG. 8 with one assignment of data significance to the transitions according to case 1 in Table 7. As an example of the relationship of Table 7 to FIG. 9, consider charge state C0, which is assigned a distinguishability index of 3/2. This value of the distinguishability index means that although charge state C0 has two exits, these exits will be used for encoding only three-fourths of the possible data sequences. FIG. 9 shows the first three data bits of these sequences and there are of course 8 such three bit sequences. A distinguishability index of 3/2 means that 6 of these sequences can be encoded from state C0 but two of these sequences cannot be encoded from state C0. The transition from state C0 to state C0 is used for encoding three of these sequences, 101, 110, and 111; and the transition from state C0 to state B2 is used for encoding the three sequences 010, 011, and 100. It is not possible to encode the data bit sequences 000 or 001 from state C0. As might be expected from the preceding explanation of the development of Table 7, the transitions into state C0 encode only data sequences that can be continued by transitions from state C0. For example, the transition from state B0 to state C0 can encode a 1 data bit in the sequence 101 and a transition from state C0 to state B2 would encode the 0 data bit in this sequence. Various data assignments can be made to the charge state transitions of FIG. 9 when the charge states have the distinguishability indexes of case 1 of Table 7. However, an appropriate choice of data assignments may simplify the encoding and decoding circuits.

The Alpha (4,3) Indirect Encoder

The coding circuits for the alpha (4,3) indirect codes identify each of the charge states separately by means of a three bit state code shown in Table 8. The three states are designated *r*, *s* and *t*. Table 9 is a truth table for the data assignments of FIG. 9 and Table 10 shows the array logic inter-connections of a minimized logic function according to Table 9. FIG. 10 shows the alpha (4,3) indirect encoder. A two bit shift register receives data and clock signals and produces signals representing the data bits ***d*0, *d*1, and *d*2.** A set of latches receive the signals *r*, *s*, and *t* from the array logic circuit and clock signals and produce the corresponding outputs ***r*-1, *s*-1, and *t*-1. Decoders receive these signals as inputs and produce the outputs shown in the column headings for the input portion of Table 10. The array logic circuit operates on these inputs to produce the state signals, which have already been described, the coded bit pair *a*0, *b*0,** and the error signal E.

The Alpha (4,3) Indirect Decoder

Table 11 shows the truth table for the alpha (4,3) decoder and corresponds directly to FIG. 9. Table 12 shows the array logic connections for a minimization of the decoder logic function and FIG. 11 shows the decoder circuit. (Appropriate shift registers to delay the code bits ***a*0, *b*0, *a*1, *b*1, and *a*2 are not shown.) It can be seen that the encoder circuit of FIG. 10 and the decoder circuit of FIG. 11** meet the constraints of (4,3) indirect codes with a minimum of logic and storage circuit components.

The Beta (4,3) Indirect Code

Figure 12:
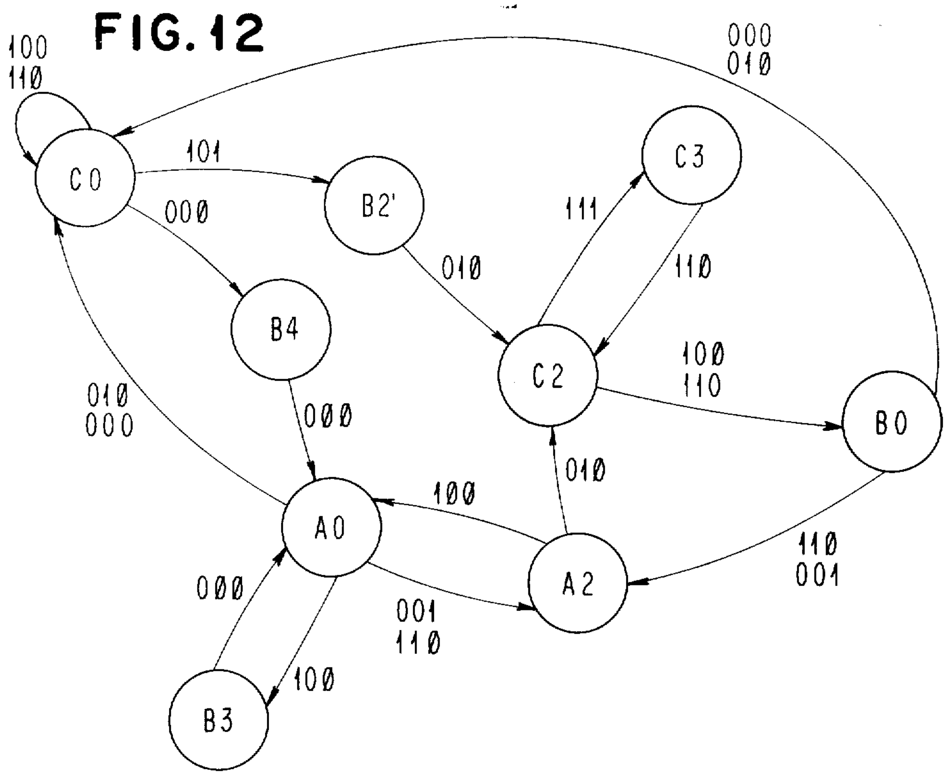
FIG. 12 is a state diagram for the beta (4,3) indirect code of this invention.

The State Diagram of FIG. 12

A second code based on case 1 in Table 7 is called the beta (4,3) indirect code. The data assignments for the transitions between charge states are shown in FIG. 12. FIG. 12 is similar to the state diagram of FIG. 8 except that state B2 has been split into two states, B2′ and B4. State B2′ has a distinguishability index of 1/2 and state B4 has a distinguishability index of 1 so that the two distinguishability indexes correspond to the distinguishability index of 3/2 for state B2 in FIG. 8. However, a different coding assignment is possible in the modified state diagram of FIG. 12, and the coding circuits differ from the counterpart circuits for the alpha (4,3) indirect code.

The Beta (4,3) Indirect Encoder

Table 13 is a truth table for the data assignments of FIG. 12 and Table 14 is a table of a minimized array logic circuit for this encoding function. FIG. 13 shows the encoder array logic of Table 14, the decoders for the inputs to the array and latches for storing the array outputs ***a*0, *b*0, *r*0 and *s*0 and producing the signals *a*-1, *b*-1, *r*-1 and *s*-1. The clock signals for the latches and the data inputs *d*0, *d*1 and *d*2 are provided by suitable means such as the circuit illustrates in FIGS. 4 and 10. It can be seen that the encoder of FIG. 10 and the encoder of FIG. 13** differ in various respects although both encoders meet the constraints of a (4,3) indirect code and neither requires infinite storage. The circuit differences may cause one or the other of the codes to be preferred when a particular circuit family is selected for implementing the encoder.

The Beta (4,3) Decoder

Table 15 is a truth table for a decoder for the code of FIG. 12, and Table 15 shows the array logic connections for a specific minimization of the truth table. FIG. 14 shows the array logic circuit and related components for the decoder. The inputs ***a*0, *b*0 and *a*1, *b*1 are provided by means such as the shift register that is shown in detail in FIG. 11.**

Other (4,3) Indirect Codes

Case 2 of the solutions in Table 7 to the equation of Table 6 corresponds to the Patel application and is included here to illustrate the generality of the analysis. Notice that the distinguishability index for state C2 is 4/3 and that some of the other states also have a distinguishability index in which there is a three in the denominator of the fraction. From a more general standpoint, each distinguishability index for case 1 has only a power of 2 in the denominator whereas some of the states in case 2 have a distinguishability index in which the denominator of the fraction is not a power of 2. Where the denominator is not a power of 2, the portion of coding sequence that can be assigned to a state is not evenly divisable, but can be represented by infinitely long data sequences. Thus, the limited storage required by the coding circuits of case 1 is associated with the binary values of the distinguishability index. Cases 3 and 4 are presented only to show the generality of the method, and specific encoding and decoding circuits can be implemented by the general techniques that have been described for case 1.

A (5,3) Indirect Code

Figure 15:
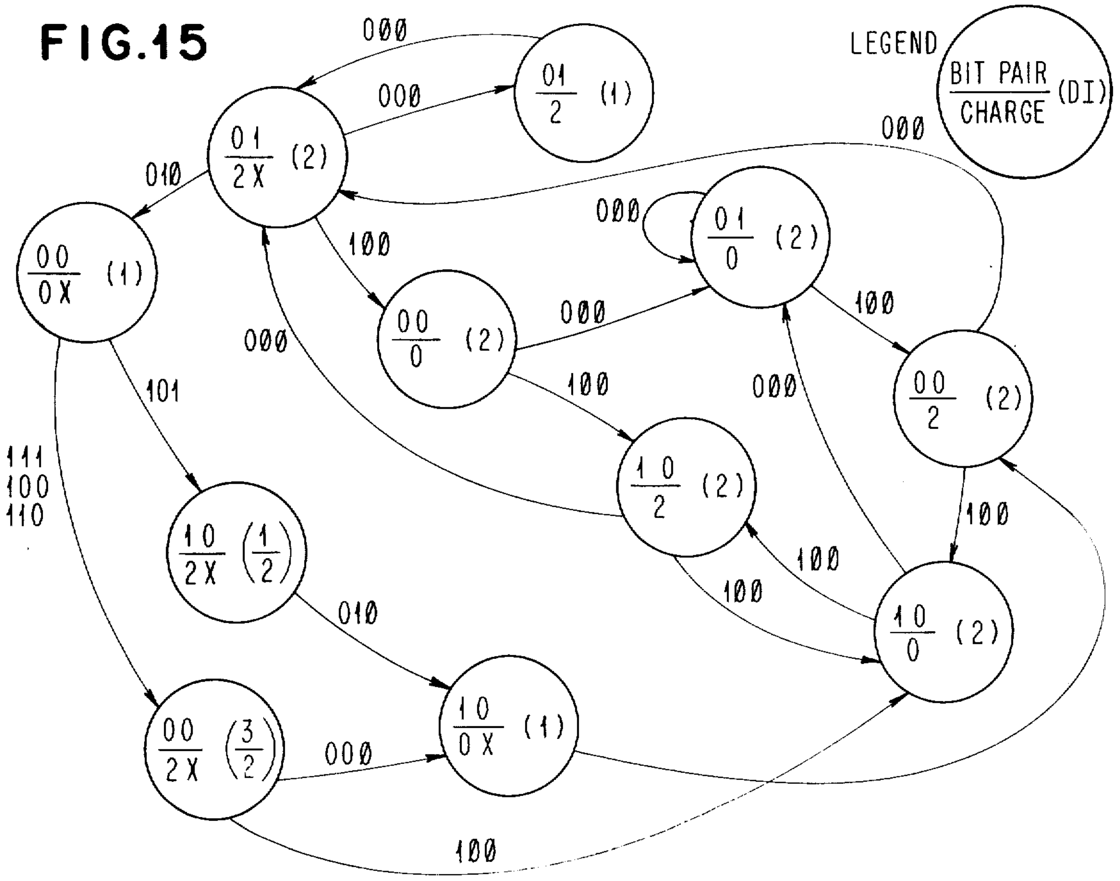
FIG. 15 is a state diagram for a (5,3) indirect code.

In a (5,3) indirect code, four adjacent 0 code bits are permitted (whereas only three adjacent 0 code bits are permitted in the (4,3) indirect codes). There are many transmission and recoding circuits and devices for which these relaxed constraints is satisfactory. The generalized state diagram for a (5,3) indirect code has more states than are required (or can be used) for encoding. FIG. 15 is a modified state diagram that describes a particularly useful code. Tables 17 and 19 are the corresponding truth tables for an encoder and a decoder and Tables 18 and 20 show the minimized array logic connections for the encoder and the decoder. It can be seen from Tables 18 and 20 that the relaxed constraints of the code permit smaller arrays. FIGS. 16 and 17 show the logic arrays and some related components of the encoder circuit and the decoder circuit; various components common to the circuits that have already been described are not shown.

The (5,3) indirect code provides significantly simplified circuits as compared with (4,3) indirect codes and in many important respects the operation of the code is only slightly inferior to the (4,3) indirect codes so that it will be the preferred code for many applications. One measure of a code is the average number of run lengths of various lengths (in window units). It has been calculated that only 5.7 percent of the run lengths are 5 window units in length; the other run lengths are 2, 3, or 4 as in the (4,3) codes. A short run length is significant in two ways: the coupling circuits (transformers or capacitors) associated with the encoding and decoding circuit must be capable of carrying the range of frequencies of the code (the band width); and in many applications the clocking circuits must remain operable without synchronization during the interval of each run length. A more complex clocking circuit design may be required if there are frequent maximum run lengths. The occurrence in the (5,3) indirect code of a run length of 5 window units in only 5.7 percent of the run lengths should permit the circuit to operate with simple clocking circuits. It can be seen from FIG. 15 that at most two run lengths of 5 window units occur in succession, regardless of the data pattern.

Data frequently has long sequences of 0 data bits or 1 data bits. Both the alpha (4,3) indirect code and the (5,3) indirect code produces a repeating code bit pair sequence 01 or 10 for either case (depending on the starting point in the state diagram). This sequence provides a small charge drift and a small band width. Other codes may produce more complex patterns with more charge drift and a wider band width. These differences may be significant in the choice of a code for a particular situation.

Those skilled in the art will recognize that the specific codes that have been described in detail illustrate a number of variations and similar codes that can be developed by the analysis presented here and implemented in various known storage and logic techniques within the spirit of the invention and the scope of the claims.

TABLE 1

| INPUTS | | | OUTPUTS | | |
|---|---|---|---|---|---|
| a-1,b-1 | r-1,s-1 | d0,d1 | a0,b0 | r0,s1 | E |
| 00 | 00 | 0— | 01 | 00 | 0 |
| 00 | 00 | 1— | 11 | 10 | 0 |
| 00 | 01 | 0— | 01 | 01 | 0 |
| 00 | 01 | 1— | 11 | 00 | 0 |
| 00 | 10 | — | — | — | 1 |
| 00 | 11 | — | 00 | 01 | 0 |
| 01 | 00 | 0— | 11 | 10 | 0 |
| 01 | 00 | 1— | 10 | 00 | 0 |
| 01 | 01 | 0— | 11 | 00 | 0 |
| 01 | 01 | 10 | 11 | 11 | 0 |
| 01 | 01 | 11 | 10 | 01 | 0 |
| 01 | 10 | 0— | — | — | 1 |
| 01 | 10 | 1— | 10 | 10 | 0 |
| 01 | 11 | — | — | — | 1 |
| 10 | 00 | 0— | 00 | 01 | 0 |
| 10 | 00 | 1— | 01 | 00 | 0 |
| 10 | 01 | 0— | — | — | 1 |
| 10 | 01 | 1— | 01 | 01 | 0 |
| 10 | 10 | 0— | 00 | 00 | 0 |
| 10 | 10 | 10 | 00 | 11 | 0 |
| 10 | 10 | 11 | 01 | 10 | 0 |
| 10 | 11 | — | — | — | 1 |
| 11 | 00 | 0— | 10 | 00 | 0 |
| 11 | 00 | 1— | 00 | 01 | 0 |
| 11 | 01 | — | — | — | 1 |
| 11 | 10 | 0— | 10 | 10 | 0 |
| 11 | 10 | 1— | 00 | 00 | 0 |
| 11 | 11 | — | 11 | 10 | 0 |

Truth Table For (6,3) Direct Code Encoder

TABLE 2

| Charge Value | Coded Value r0,s0 | Decoded Value |
|---|---|---|
| 0 | 00 | 1000 |
| -2 | 01 | 0100 |
| +2 | 10 | 0010 |
| × | 11 | 0001 |

TABLE 3

| DECODED INPUTS | | | OUTPUTS | | |
|---|---|---|---|---|---|
| a-1,b-1 | r-1,s-1 | d0,d1 | $\bar{a}0,\bar{b}0$ | $\bar{r}0$,s0 | $\bar{E}$ |
| 1010 | 0011 | 0010 | 01 | 01 | 0 |
| 0101 | 1100 | 0001 | 01 | 10 | 0 |
| 1111 | 0100 | 1101 | 00 | 10 | 0 |
| 0010 | 1101 | 1100 | 00 | 01 | 0 |
| 1011 | 0100 | 1100 | 00 | 01 | 0 |
| 1001 | 0010 | 0011 | 10 | 10 | 0 |
| 0001 | 1100 | 0011 | 11 | 11 | 0 |
| 0111 | 0100 | 0011 | 00 | 01 | 0 |
| 0111 | 1000 | 0011 | 00 | 10 | 0 |
| 0011 | 1010 | 1100 | 01 | 00 | 1 |
| 0101 | 1010 | 0011 | 01 | 00 | 1 |
| 1010 | 1111 | 1100 | 10 | 10 | 0 |
| 1001 | 1001 | 1111 | 00 | 00 | 1 |
| 0010 | 1110 | 0011 | 10 | 00 | 1 |
| 1011 | 1100 | 1100 | 00 | 10 | 0 |
| 1011 | 0100 | 1111 | 00 | 10 | 0 |
| 1110 | 0001 | 1111 | 11 | 11 | 0 |

TABLE 3-continued

| DECODED INPUTS a-1,b-1 | r-1,s-1 | d0,d1 | OUTPUTS a0,b0 | r0,s0 | E |
|---|---|---|---|---|---|
| 1100 | 1100 | 1111 | 00 | 00 | 1 |

Array Logic For (6,3) Direct Code Encoder

TABLE 4

| a0,b0 | INPUTS a1,b1 | a2,b2 | OUTPUTS d0 | E |
|---|---|---|---|---|
| 00 | 00 | —0 | — | 1 |
| 00 | 00 | —1 | 0 | 0 |
| 00 | 01 | 0— | — | 1 |
| 00 | 01 | 1— | 0 | 0 |
| 00 | 10 | — | — | 1 |
| 00 | 11 | 00 | 1 | 0 |
| 00 | 11 | 01 | — | 1 |
| 00 | 11 | 1— | 1 | 0 |
| 01 | 0— | — | — | 1 |
| 01 | 10 | 0— | 1 | 0 |
| 01 | 10 | 1— | — | 1 |
| 01 | 11 | 00 | 0 | 0 |
| 01 | 11 | 01 | — | 1 |
| 01 | 11 | 10 | 0 | 0 |
| 01 | 11 | 11 | 1 | 0 |
| 10 | 00 | 00 | 1 | 0 |
| 10 | 00 | 01 | 0 | 0 |
| 10 | 00 | 10 | — | 1 |
| 10 | 00 | 11 | 0 | 0 |
| 10 | 01 | 0— | — | 1 |
| 10 | 01 | 1— | 1 | 0 |
| 10 | 1— | — | — | 1 |
| 11 | 00 | 0— | 1 | 0 |
| 11 | 00 | 10 | — | 1 |
| 11 | 00 | 11 | 1 | 0 |
| 11 | 01 | — | — | 1 |
| 11 | 10 | 0— | 0 | 0 |
| 11 | 10 | 1— | — | 1 |
| 11 | 11 | 00 | 0 | 0 |
| 11 | 11 | 01 | — | 1 |
| 11 | 11 | 10 | 0 | 0 |
| 11 | 11 | 11 | — | 1 |

Truth Table for (6,3) Direct Code Decoder

TABLE 5

| DECODED INPUTS a0,b0 | a1,b1 | a2,b2 | OUTPUTS d0 | E |
|---|---|---|---|---|
| 0101 | 0010 | 1100 | 0 | 1 |
| 1010 | 0100 | 0011 | 0 | 1 |
| 1101 | 0110 | 0011 | 1 | 0 |
| 1011 | 0110 | 1100 | 1 | 0 |
| 1010 | 1000 | 0101 | 1 | 1 |
| 0101 | 0001 | 1010 | 1 | 1 |
| 0011 | 1000 | 1101 | 0 | 1 |
| 1100 | 0001 | 1011 | 0 | 1 |

Array Logic for (6,3) Direct Code Decoder

TABLE 6

| | | | | | | | | | | |
|---|---|---|---|---|---|---|---|---|---|---|
| 1 | —1 | 0 | 0 | 0 | 0 | 0 | 0 | DI(C0) | | 0 |
| 0 | 2 | —1 | —1 | 0 | 0 | 0 | 0 | DI(B2) | | 0 |
| 0 | 0 | 2 | 0 | —1 | 0 | —1 | 0 | DI(C2) | | 0 |
| —1 | 0 | 0 | 2 | 0 | —1 | 0 | —1 . | DI(A0) | = | 0 |
| 0 | 0 | —1 | 0 | 2 | 0 | 0 | 0 | DI(C3) | | 0 |
| 0 | 0 | —1 | —1 | 0 | 2 | 0 | 0 | DI(A2) | | 0 |
| —1 | 0 | 0 | 0 | 0 | —1 | 2 | 0 | DI(B0) | | 0 |
| 0 | 0 | 0 | —1 | 0 | 0 | 0 | 2 | DI(B3) | | 0 |

TABLE 6-continued

Distinguishability Index For (4,3) Indirect Codes

TABLE 7

| C0 | B2 | C2 | A0 | C3 | A2 | B0 | B3 | |
|---|---|---|---|---|---|---|---|---|
| a | a | 2/3a | 4/3a | 1/3a | a | a | 2/3a | General |
| 3/2 | 3/2 | 1 | 2 | 1/2 | 3/2 | 3/2 | 1 | Case 1 |
| 2 | 2 | 4/3 | 8/3 | 2/3 | 2 | 2 | 4/3 | Case 2 |
| 3 | 3 | 2 | 4 | 1 | 3 | 3 | 2 | Case 3 |
| 6 | 6 | 4 | 8 | 2 | 6 | 6 | 4 | Case 4 |

Useful Distinguishability Indexes For (4,3) Indirect Codes

TABLE 8

| State | State Code | a0,b0 |
|---|---|---|
| B0 | 0 0 0 | 00 |
| B2 | 0 0 1 | 00 |
| B3 | 0 1 0 | 00 |
| C0 | 0 1 1 | 01 |
| A0 | 1 0 0 | 10 |
| A2 | 1 0 1 | 10 |
| C2 | 1 1 0 | 01 |
| C3 | 1 1 1 | 01 |

Code State Assignment

TABLE 9

| INPUTS r—1 | s—1 | t—1 | d0 | d1 | d2 | OUTPUTS r0 | s0 | t0 | a0 | b0 | E |
|---|---|---|---|---|---|---|---|---|---|---|---|
| 0 | 0 | 0 | 0 | 0 | — | — | — | — | — | — | 1 |
| 0 | 0 | 0 | 0 | 1 | — | 0 | 1 | 1 | 0 | 1 | 0 |
| 0 | 0 | 0 | 1 | 0 | 0 | 1 | 0 | 1 | 1 | 0 | 0 |
| 0 | 0 | 0 | 1 | 0 | 1 | 0 | 1 | 1 | 0 | 1 | 0 |
| 0 | 0 | 0 | 1 | 1 | — | 1 | 0 | 1 | 1 | 0 | 0 |
| 0 | 0 | 1 | 0 | 0 | — | 1 | 1 | 0 | 0 | 1 | 0 |
| 0 | 0 | 1 | 0 | 1 | — | — | — | — | — | — | 1 |
| 0 | 0 | 1 | 1 | — | — | 1 | 0 | 0 | 1 | 0 | 0 |
| 0 | 1 | 0 | 0 | — | — | 1 | 0 | 0 | 1 | 0 | 0 |
| 0 | 1 | 0 | 1 | — | — | — | — | — | — | — | 1 |
| 0 | 1 | 1 | 0 | 0 | — | — | — | — | — | — | 1 |
| 0 | 1 | 1 | 0 | 1 | — | 0 | 0 | 1 | 0 | 0 | 0 |
| 0 | 1 | 1 | 1 | 0 | 0 | 0 | 0 | 1 | 0 | 0 | 0 |
| 0 | 1 | 1 | 1 | 0 | 1 | 0 | 1 | 1 | 0 | 1 | 0 |
| 0 | 1 | 1 | 1 | 1 | — | 0 | 1 | 1 | 0 | 1 | 0 |
| 1 | 0 | 0 | 0 | 0 | 0 | 1 | 0 | 1 | 1 | 0 | 0 |
| 1 | 0 | 0 | 0 | 0 | 1 | 0 | 1 | 1 | 0 | 1 | 0 |
| 1 | 0 | 0 | 0 | 1 | — | 1 | 0 | 1 | 1 | 0 | 0 |
| 1 | 0 | 0 | 1 | 0 | — | 0 | 1 | 0 | 0 | 0 | 0 |
| 1 | 0 | 0 | 1 | 1 | — | 0 | 1 | 1 | 0 | 1 | 0 |
| 1 | 0 | 1 | 0 | 0 | — | 1 | 1 | 0 | 0 | 1 | 0 |
| 1 | 0 | 1 | 0 | 1 | — | — | — | — | — | — | 1 |
| 1 | 0 | 1 | 1 | — | — | 1 | 1 | 0 | 1 | 0 | 0 |
| 1 | 1 | 0 | 0 | 0 | 0 | 1 | 1 | 1 | 0 | 1 | 0 |
| 1 | 1 | 0 | 0 | 0 | 1 | 0 | 0 | 0 | 0 | 0 | 0 |
| 1 | 1 | 0 | 0 | 1 | — | 0 | 0 | 0 | 0 | 0 | 0 |
| 1 | 1 | 0 | 1 | — | — | — | — | — | — | — | 1 |
| 1 | 1 | 1 | 0 | 0 | — | 1 | 1 | 0 | 0 | 1 | 0 |
| 1 | 1 | 1 | 0 | 1 | — | — | — | — | — | — | 1 |
| 1 | 1 | 1 | 1 | — | — | — | — | — | — | — | 1 |

Truth Table For Alpha (4,3) Indirect Code Encoder

TABLE 10

| DECODED INPUTS r-1,s-1 | t-1,d0 | d1,d2 | OUTPUTS r0 | $\bar{s}$0 | $\bar{t}$0 | a0 | $\bar{b}$0 | E |
|---|---|---|---|---|---|---|---|---|
| 1111 | 1010 | 1000 | 1 | 0 | 0 | 0 | 0 | 0 |
| 1101 | 0101 | 1000 | 0 | 1 | 0 | 0 | 1 | 0 |
| 0100 | 0110 | 1100 | 1 | 1 | 1 | 0 | 1 | 1 |
| 1000 | 1000 | 1100 | 1 | 0 | 0 | 0 | 0 | 1 |
| 0111 | 0100 | 1100 | 0 | 0 | 1 | 0 | 1 | 0 |
| 1111 | 0010 | 0011 | 0 | 1 | 0 | 0 | 1 | 0 |
| 1011 | 0010 | 0011 | 1 | 1 | 1 | 0 | 1 | 1 |
| 1111 | 0010 | 1100 | 1 | 0 | 1 | 0 | 0 | 0 |
| 0001 | 0101 | 1111 | 0 | 1 | 0 | 0 | 0 | 1 |
| 1001 | 0001 | 1111 | 0 | 1 | 0 | 0 | 0 | 0 |
| 0101 | 1100 | 0111 | 0 | 1 | 1 | 0 | 1 | 0 |
| 0101 | 0100 | 1111 | 1 | 1 | 1 | 1 | 1 | 1 |
| 1101 | 0100 | 1011 | 1 | 1 | 0 | 1 | 1 | 0 |
| 0110 | 1000 | 1011 | 1 | 1 | 0 | 1 | 1 | 0 |

TABLE 10-continued

| DECODED INPUTS r-1,s-1 | t-1,d0 | d1,d2 | OUTPUTS r0 | $\bar{s}0$ | $\bar{t}0$ | a0 | $\bar{b}0$ | E |
|---|---|---|---|---|---|---|---|---|
| 1011 | 0001 | 1111 | 1 | 0 | 1 | 1 | 1 | 0 |
| 0100 | 1100 | 1111 | 1 | 1 | 1 | 1 | 1 | 0 |

Array Logic For Alpha (4,3) Indirect Code Encoder

TABLE 11

| INPUTS r0, | s0, | t0 | a0, | b0 | a1, | b1 | a2, | b2 | OUTPUTS r0 | s0 | t0 | d0 | E |
|---|---|---|---|---|---|---|---|---|---|---|---|---|---|
| 0 | 0 | 0 | 0 | 0 | — | — | — | — | | | | | 1 |
| 0 | 0 | 0 | 0 | 1 | 0 | 1 | — | — | 0 | 1 | 1 | 0 | 0 |
| 0 | 0 | 0 | 0 | 1 | 1 | — | — | — | | | | | 1 |
| 0 | 0 | 0 | 1 | 0 | 0 | 0 | — | — | | | | | 1 |
| 0 | 0 | 0 | 1 | 0 | 0 | 1 | — | — | 1 | 0 | 1 | 1 | 0 |
| 0 | 0 | 0 | 1 | 0 | 1 | 0 | — | — | 1 | 0 | 1 | 1 | 0 |
| 0 | 0 | 0 | 1 | 0 | 1 | 1 | — | — | | | | | 1 |
| 0 | 0 | 0 | 1 | 1 | — | — | — | — | | | | | 1 |
| 0 | 0 | 1 | 0 | 0 | — | — | — | — | | | | | 1 |
| 0 | 0 | 1 | 0 | 1 | 0 | — | — | — | 1 | 1 | 0 | 0 | 0 |
| 0 | 0 | 1 | 0 | 1 | 1 | — | — | — | | | | | 1 |
| 0 | 0 | 1 | 1 | 0 | 0 | — | — | — | 1 | 0 | 0 | 1 | 0 |
| 0 | 0 | 1 | 1 | 0 | 1 | 0 | — | — | 1 | 0 | 0 | 1 | 0 |
| 0 | 0 | 1 | 1 | 1 | — | — | — | — | | | | | 1 |
| 0 | 1 | 0 | 0 | — | — | — | — | — | | | | | 1 |
| 0 | 1 | 0 | 1 | 0 | 0 | — | — | — | 1 | 0 | 0 | 0 | 0 |
| 0 | 1 | 0 | 1 | 0 | 1 | 0 | — | — | 1 | 0 | 0 | 0 | 0 |
| 0 | 1 | 0 | 1 | 0 | 1 | 1 | — | — | | | | | 1 |
| 0 | 1 | 0 | 1 | 1 | — | — | — | — | | | | | 1 |
| 0 | 1 | 1 | 0 | 0 | 0 | 0 | — | — | | | | | 1 |
| 0 | 1 | 1 | 0 | 0 | 0 | 1 | — | — | 0 | 0 | 1 | 1 | 0 |
| 0 | 1 | 1 | 0 | 0 | 1 | 0 | — | — | 0 | 0 | 1 | 0 | 0 |
| 0 | 1 | 1 | 0 | 0 | 1 | 1 | — | — | | | | | 1 |
| 0 | 1 | 1 | 0 | 1 | 0 | — | — | — | 0 | 1 | 1 | 1 | 0 |
| 0 | 1 | 1 | 0 | 1 | 1 | — | — | — | | | | | 1 |
| 0 | 1 | 1 | 1 | — | — | — | — | — | | | | | 1 |
| 1 | 0 | 0 | 0 | 0 | 0 | — | — | — | | | | | 1 |
| 1 | 0 | 0 | 0 | 0 | 1 | 0 | — | — | 0 | 1 | 0 | 1 | 0 |
| 1 | 0 | 0 | 0 | 0 | 1 | 1 | — | — | | | | | 1 |
| 1 | 0 | 0 | 0 | 1 | 0 | 0 | 0 | 0 | | | | | 1 |
| 1 | 0 | 0 | 0 | 1 | 0 | 0 | 0 | 1 | 0 | 1 | 1 | 1 | 0 |
| 1 | 0 | 0 | 0 | 1 | 0 | 0 | 1 | 0 | 0 | 1 | 1 | 0 | 0 |
| 1 | 0 | 0 | 0 | 1 | 0 | 0 | 1 | 1 | | | | | 1 |
| 1 | 0 | 0 | 0 | 1 | 1 | — | — | — | | | | | 1 |
| 1 | 0 | 0 | 1 | 0 | 0 | 0 | — | — | | | | | 1 |
| 1 | 0 | 0 | 1 | 0 | 0 | 1 | — | — | 1 | 0 | 1 | 0 | 0 |
| 1 | 0 | 0 | 1 | 0 | 1 | 0 | — | — | 1 | 0 | 1 | 0 | 0 |
| 1 | 0 | 0 | 1 | 0 | 1 | 1 | — | — | | | | | 1 |
| 1 | 0 | 0 | 1 | 1 | — | — | — | — | | | | | 1 |
| 1 | 0 | 1 | 0 | 1 | 0 | — | — | — | 1 | 1 | 0 | 0 | 0 |
| 1 | 0 | 1 | 0 | 1 | 1 | — | — | — | | | | | 1 |
| 1 | 0 | 1 | 1 | 0 | 0 | — | — | — | 1 | 0 | 0 | 1 | 0 |
| 1 | 0 | 1 | 1 | 0 | 1 | 0 | — | — | 1 | 0 | 0 | 1 | 0 |
| 1 | 0 | 1 | 1 | 0 | 1 | 1 | — | — | | | | | 1 |
| 1 | 0 | 1 | 1 | 1 | — | — | — | — | | | | | 1 |
| 1 | 1 | 0 | 0 | 0 | 0 | 0 | — | — | | | | | 1 |
| 1 | 1 | 0 | 0 | 0 | 0 | 1 | — | — | 0 | 0 | 0 | 0 | 0 |
| 1 | 1 | 0 | 0 | 0 | 1 | 0 | — | — | 0 | 0 | 0 | 0 | 0 |
| 1 | 1 | 0 | 0 | 0 | 1 | 1 | — | — | | | | | 1 |
| 1 | 1 | 0 | 0 | 1 | 0 | 0 | — | — | | | | | 1 |
| 1 | 1 | 0 | 0 | 1 | 0 | 1 | — | — | 1 | 1 | 1 | 0 | 0 |

TABLE 11-continued

| INPUTS r0, | s0, | t0 | a0, | b0 | a1, | b1 | a2, | b2 | OUTPUTS r0 | s0 | t0 | d0 | E |
|---|---|---|---|---|---|---|---|---|---|---|---|---|---|
| 1 | 1 | 0 | 0 | 1 | 1 | — | — | — | | | | | 1 |
| 1 | 1 | 0 | 1 | — | — | — | — | — | | | | | 1 |
| 1 | 1 | 1 | 0 | 0 | — | — | — | — | | | | | 1 |
| 1 | 1 | 1 | 0 | 1 | 0 | — | — | — | 1 | 1 | 0 | 0 | 0 |
| 1 | 1 | 1 | 0 | 1 | 1 | — | — | — | | | | | 1 |
| 1 | 1 | 1 | 1 | — | — | — | — | — | | | | | 1 |
| 0 | 0 | 0 | 0 | 1 | 0 | 0 | 0 | 0 | | | | | 1 |
| 0 | 0 | 0 | 0 | 1 | 0 | 0 | 0 | 1 | 0 | 1 | 1 | 0 | 0 |
| 0 | 0 | 0 | 0 | 1 | 0 | 0 | 1 | 0 | 0 | 1 | 1 | 1 | 0 |
| 0 | 0 | 0 | 0 | 1 | 0 | 0 | 1 | 1 | | | | | 1 |
| 0 | 0 | 1 | 1 | 0 | 1 | 1 | | | | | | | 1 |
| 1 | 0 | 1 | 0 | 0 | | | | | | | | | 1 |

Truth Table For Alpha (4,3) Indirect Code Decoder

TABLE 12

| DECODED INPUTS r-1,s-1 | t-1 | a0,b0 | a1,b1 | a2,b2 | OUTPUTS r0 | $\bar{s}0$ | $\bar{t}0$ | d0 | $\bar{E}$ |
|---|---|---|---|---|---|---|---|---|---|
| 1101 | 10 | 1101 | 1001 | 1011 | 0 | 0 | 0 | 1 | 0 |
| 0111 | 10 | 1101 | 1001 | 1101 | 0 | 0 | 0 | 1 | 0 |
| 1010 | 11 | 0100 | 1100 | 0110 | 0 | 0 | 0 | 0 | 1 |
| 1011 | 11 | 0100 | 0100 | 1111 | 0 | 0 | 0 | 0 | 1 |
| 0101 | 10 | 0111 | 1111 | 1111 | 1 | 0 | 0 | 0 | 0 |
| 0010 | 10 | 1000 | 0010 | 1111 | 0 | 0 | 1 | 1 | 1 |
| 0100 | 01 | 1000 | 0110 | 1111 | 0 | 1 | 0 | 0 | 1 |
| 0100 | 11 | 1101 | 1101 | 1111 | 0 | 0 | 0 | 1 | 0 |
| 1111 | 01 | 0100 | 1100 | 1111 | 0 | 0 | 0 | 0 | 1 |
| 0001 | 10 | 1000 | 0110 | 1111 | 0 | 1 | 1 | 0 | 1 |
| 0110 | 10 | 1101 | 0101 | 1111 | 0 | 1 | 1 | 0 | 0 |
| 1011 | 01 | 1111 | 1111 | 1111 | 1 | 0 | 1 | 0 | 0 |
| 0100 | 10 | 0010 | 1110 | 1110 | 0 | 1 | 0 | 1 | 1 |
| 1111 | 01 | 0011 | 1111 | 1111 | 0 | 0 | 1 | 1 | 0 |
| 1010 | 11 | 0010 | 0110 | 1111 | 0 | 0 | 0 | 0 | 1 |
| 1111 | 11 | 0011 | 1111 | 1111 | 1 | 1 | 0 | 0 | 0 |
| 1001 | 11 | 0011 | 1111 | 1111 | 1 | 1 | 0 | 1 | 0 |
| 1010 | 01 | 0110 | 1100 | 1111 | 0 | 0 | 0 | 0 | 1 |

Array Logic For Alpha (4,3) Indirect Code Decoder

TABLE 13

| INPUTS a-1 | b-1 | r-1 | s-1 | d0 | d1 | d2 | OUTPUTS a0 | b0 | r0 | s0 | E |
|---|---|---|---|---|---|---|---|---|---|---|---|
| 0 | 0 | 0 | 0 | 0 | 0 | 0 | 0 | 1 | 0 | 0 | 0 |
| 0 | 0 | 0 | 0 | 0 | 0 | 1 | 1 | 0 | 0 | 1 | 0 |
| 0 | 0 | 0 | 0 | 0 | 1 | — | 0 | 1 | 0 | 0 | 0 |
| 0 | 0 | 0 | 0 | 1 | 0 | — | — | — | — | — | 1 |
| 0 | 0 | 0 | 0 | 1 | 1 | — | 1 | 0 | 0 | 1 | 0 |
| 0 | 0 | 0 | 1 | 0 | 0 | — | — | — | — | — | 1 |
| 0 | 0 | 0 | 1 | 0 | 1 | — | 0 | 1 | 0 | 1 | 0 |
| 0 | 0 | 0 | 1 | 1 | — | — | — | — | — | — | 1 |
| 0 | 0 | 1 | 0 | 0 | — | — | 1 | 0 | 0 | 0 | 0 |
| 0 | 0 | 1 | 0 | 1 | — | — | — | — | — | — | 1 |
| 0 | 0 | 1 | 1 | 0 | — | — | 1 | 0 | 0 | 0 | 0 |
| 0 | 0 | 1 | 1 | 1 | — | — | — | — | — | — | 1 |
| 0 | 1 | 0 | 0 | 0 | 0 | — | 0 | 0 | 1 | 1 | 0 |
| 0 | 1 | 0 | 0 | 0 | 1 | — | — | — | — | 1 | |
| 0 | 1 | 0 | 0 | 1 | 0 | 0 | 0 | 1 | 0 | 0 | 0 |
| 0 | 1 | 0 | 0 | 1 | 0 | 1 | 0 | 0 | 0 | 1 | 0 |
| 0 | 1 | 0 | 0 | 1 | 1 | — | 0 | 1 | 0 | 0 | 0 |
| 0 | 1 | 0 | 1 | 0 | — | — | — | — | — | — | 1 |
| 0 | 1 | 0 | 1 | 1 | 0 | — | 0 | 0 | 0 | 0 | 0 |
| 0 | 1 | 0 | 1 | 1 | 1 | 0 | 0 | 0 | 0 | 0 | 0 |
| 0 | 1 | 0 | 1 | 1 | 1 | 1 | 0 | 1 | 1 | 0 | 0 |
| 0 | 1 | 1 | 0 | 0 | — | — | — | — | — | — | 1 |
| 0 | 1 | 1 | 0 | 1 | 0 | — | — | — | — | — | 1 |
| 0 | 1 | 1 | 0 | 1 | 1 | — | 0 | 1 | 0 | 1 | 0 |
| 0 | 1 | 1 | 1 | — | — | — | — | — | — | — | 1 |
| 1 | 0 | 0 | 0 | 0 | 0 | 0 | 0 | 1 | 0 | 0 | 0 |
| 1 | 0 | 0 | 0 | 0 | 0 | 1 | 1 | 0 | 0 | 1 | 0 |
| 1 | 0 | 0 | 0 | 0 | 1 | — | 0 | 1 | 0 | 0 | 0 |
| 1 | 0 | 0 | 0 | 1 | 0 | — | 0 | 0 | 1 | 0 | 0 |
| 1 | 0 | 0 | 0 | 1 | 1 | — | 1 | 0 | 0 | 1 | 0 |
| 1 | 0 | 0 | 1 | 0 | 0 | — | — | — | — | — | 1 |
| 1 | 0 | 0 | 1 | 0 | 1 | — | 0 | 1 | 0 | 1 | 0 |
| 1 | 0 | 0 | 1 | 1 | — | — | 1 | 0 | 0 | 0 | 0 |

Truth Table For Beta (4,3) Indirect Code Encoder

TABLE 14

| DECODED INPUTS | | | | OUTPUTS | | | | |
|---|---|---|---|---|---|---|---|---|
| a-1,b-1 | r-1,s-1 | d0,d1 | d2 | a0 | $\overline{b0}$ | r0 | s0 | $\overline{E}$ |
| 1100 | 0101 | 0001 | 01 | 0 | 0 | 1 | 0 | 0 |
| 1100 | 1011 | 0010 | 01 | 0 | 0 | 0 | 1 | 0 |
| 1111 | 0101 | 1011 | 10 | 0 | 1 | 0 | 0 | 0 |
| 1010 | 1100 | 1000 | 01 | 1 | 0 | 0 | 1 | 0 |
| 0100 | 0010 | 0001 | 11 | 0 | 0 | 0 | 1 | 1 |
| 1010 | 1000 | 0010 | 11 | 0 | 1 | 1 | 0 | 0 |
| 1100 | 0011 | 1110 | 11 | 1 | 1 | 0 | 0 | 0 |
| 1010 | 0100 | 0100 | 11 | 0 | 0 | 0 | 1 | 1 |
| 0100 | 1111 | 1100 | 11 | 0 | 1 | 1 | 1 | 0 |
| 1010 | 0100 | 1011 | 11 | 1 | 1 | 0 | 0 | 0 |
| 1111 | 1000 | 1001 | 11 | 0 | 0 | 0 | 0 | 1 |
| 1011 | 1011 | 1100 | 11 | 0 | 0 | 0 | 0 | 1 |
| 1111 | 1111 | 1010 | 01 | 0 | 1 | 0 | 0 | 0 |
| 1010 | 1000 | 0001 | 11 | 1 | 1 | 0 | 1 | 0 |
| 0111 | 1100 | 0011 | 11 | 0 | 0 | 0 | 0 | 1 |
| 0011 | 0011 | 1111 | 11 | 0 | 1 | 0 | 0 | 1 |
| 0001 | 1111 | 1111 | 11 | 0 | 1 | 0 | 0 | 1 |

Array Logic For Beta (4,3) Indirect Code Encoder

TABLE 15

| INPUTS | | | | | | | OUTPUTS | | | | |
|---|---|---|---|---|---|---|---|---|---|---|---|
| r-1 | s-1 | t-1 | a-1 | b-1 | a-2 | b-2 | r0 | s0 | t0 | d0 | E |
| 0 | 0 | 0 | 0 | 0 | — | — | | | | | 1 |
| 0 | 0 | 0 | 0 | 1 | 0 | — | 0 | 1 | 1 | 0 | 0 |
| 0 | 0 | 0 | 0 | 1 | 1 | — | | | | | 1 |
| 0 | 0 | 0 | 1 | 0 | 0 | 0 | | | | | 1 |
| 0 | 0 | 0 | 1 | 0 | 0 | 1 | 1 | 0 | 1 | 0 | 0 |
| 0 | 0 | 0 | 1 | 0 | 1 | 0 | 1 | 0 | 1 | 1 | 0 |
| 0 | 0 | 0 | 1 | 0 | 1 | 1 | | | | | 1 |
| 0 | 0 | 0 | 1 | 1 | — | — | | | | | 1 |
| 0 | 0 | 1 | 0 | 0 | — | — | | | | | 1 |
| 0 | 0 | 1 | 0 | 1 | 0 | — | 1 | 1 | 0 | 0 | 0 |
| 0 | 0 | 1 | 0 | 1 | 1 | — | | | | | 1 |
| 0 | 0 | 1 | 1 | 0 | 0 | — | 1 | 0 | 0 | 0 | 0 |
| 0 | 0 | 1 | 1 | 0 | 1 | 0 | 1 | 0 | 0 | 0 | 0 |
| 0 | 0 | 1 | 1 | 0 | 1 | 1 | | | | | 1 |
| 0 | 0 | 1 | 1 | 1 | — | — | | | | | 1 |
| 0 | 1 | 0 | 0 | — | — | — | | | | | 1 |
| 0 | 1 | 0 | 1 | 0 | 0 | — | 1 | 0 | 0 | 0 | 0 |
| 0 | 1 | 0 | 1 | 0 | 1 | 0 | 1 | 0 | 0 | 0 | 0 |
| 0 | 1 | 0 | 1 | 0 | 1 | 1 | | | | | 1 |
| 0 | 1 | 0 | 1 | 1 | — | — | | | | | 1 |
| 0 | 1 | 1 | 0 | 0 | 0 | 0 | | | | | 1 |
| 0 | 1 | 1 | 0 | 0 | 0 | 1 | 0 | 0 | 1 | 1 | 0 |
| 0 | 1 | 1 | 0 | 0 | 1 | 0 | 0 | 0 | 1 | 0 | 0 |
| 0 | 1 | 1 | 0 | 0 | 1 | 1 | | | | | 1 |
| 0 | 1 | 1 | 0 | 1 | — | — | 0 | 1 | 1 | 1 | 0 |
| 0 | 1 | 1 | 1 | — | — | — | | | | | 1 |
| 1 | 0 | 0 | 0 | 0 | 0 | — | | | | | 1 |
| 1 | 0 | 0 | 0 | 0 | 1 | 0 | 0 | 1 | 0 | 1 | 0 |
| 1 | 0 | 0 | 0 | 0 | 1 | 1 | | | | | 1 |
| 1 | 0 | 0 | 0 | 1 | 0 | — | 0 | 1 | 1 | 0 | 0 |
| 1 | 0 | 0 | 0 | 1 | 1 | 0 | 0 | 1 | 1 | 0 | 0 |
| 1 | 0 | 0 | 0 | 1 | 1 | 1 | | | | | 1 |
| 1 | 0 | 0 | 1 | 0 | 0 | 0 | | | | | 1 |
| 1 | 0 | 0 | 1 | 0 | 0 | 1 | 1 | 0 | 1 | 0 | 0 |
| 1 | 0 | 0 | 1 | 0 | 1 | 0 | 1 | 0 | 1 | 1 | 0 |
| 1 | 0 | 0 | 1 | 0 | 1 | 1 | | | | | 1 |
| 1 | 0 | 0 | 1 | 1 | — | — | | | | | 1 |
| 1 | 0 | 1 | 0 | 0 | — | — | | | | | 1 |
| 1 | 0 | 1 | 0 | 1 | 0 | — | 1 | 1 | 0 | 0 | 0 |
| 1 | 0 | 1 | 0 | 1 | 1 | — | | | | | 1 |
| 1 | 0 | 1 | 1 | 0 | 0 | — | 1 | 0 | 0 | 1 | 0 |
| 1 | 0 | 1 | 1 | 0 | 1 | 0 | 1 | 0 | 0 | 1 | 0 |
| 1 | 0 | 1 | 1 | 0 | 1 | 1 | | | | | 1 |
| 1 | 0 | 1 | 1 | 1 | — | — | | | | | 1 |
| 1 | 1 | 0 | 0 | 0 | 0 | 0 | | | | | 1 |
| 1 | 1 | 0 | 0 | 0 | 0 | 1 | 0 | 0 | 0 | 1 | 0 |
| 1 | 1 | 0 | 0 | 0 | 1 | 0 | 0 | 0 | 0 | 1 | 0 |
| 1 | 1 | 0 | 0 | 0 | 1 | 1 | | | | | 1 |
| 1 | 1 | 0 | 0 | 1 | 0 | 0 | | | | | 1 |
| 1 | 1 | 0 | 0 | 1 | 0 | 1 | 1 | 1 | 1 | 1 | 0 |
| 1 | 1 | 0 | 0 | 1 | 1 | — | | | | | 1 |
| 1 | 1 | 0 | 1 | — | — | — | | | | | 1 |
| 1 | 1 | 1 | 0 | 0 | — | — | | | | | 1 |
| 1 | 1 | 1 | 0 | 1 | 0 | — | 1 | 1 | 0 | 1 | 0 |
| 1 | 1 | 1 | 0 | 1 | 1 | — | | | | | 1 |
| 1 | 1 | 1 | 1 | — | — | — | | | | | 1 |

Truth Table For Beta (4,3) Indirect Code Decoder

TABLE 16

| INPUTS | | | | OUTPUTS | | | | |
|---|---|---|---|---|---|---|---|---|
| r-1,s-1 | t-1 | a0,b0 | a1,b1 | r0 | $\overline{s0}$ | $\overline{t0}$ | d0 | $\overline{E}$ |
| 0010 | 10 | 1110 | 0010 | 0 | 0 | 0 | 0 | 1 |
| 0100 | 01 | 1000 | 0110 | 0 | 1 | 0 | 0 | 1 |
| 1111 | 10 | 1001 | 1111 | 0 | 0 | 1 | 1 | 0 |
| 0001 | 11 | 0100 | 0100 | 1 | 0 | 0 | 1 | 1 |
| 1111 | 11 | 1001 | 1101 | 0 | 0 | 0 | 1 | 0 |
| 0101 | 01 | 0100 | 1100 | 0 | 0 | 0 | 1 | 1 |
| 1110 | 10 | 0010 | 0110 | 1 | 1 | 0 | 0 | 1 |
| 1010 | 11 | 0100 | 1100 | 0 | 0 | 0 | 0 | 1 |
| 1010 | 01 | 0010 | 1110 | 0 | 1 | 0 | 0 | 1 |
| 0100 | 01 | 0100 | 1111 | 0 | 0 | 0 | 1 | 1 |
| 1011 | 10 | 1011 | 1011 | 0 | 0 | 0 | 1 | 0 |
| 0001 | 10 | 1000 | 0110 | 0 | 1 | 1 | 1 | 1 |
| 1011 | 01 | 1111 | 1111 | 1 | 0 | 1 | 0 | 0 |
| 0100 | 10 | 0010 | 1110 | 1 | 1 | 1 | 0 | 1 |
| 0111 | 01 | 0011 | 1111 | 0 | 0 | 0 | 1 | 0 |

Array Logic For Beta (4,3) Indirect Code Decoder

TABLE 17

| INPUTS | | | | | | | OUTPUTS | | | | |
|---|---|---|---|---|---|---|---|---|---|---|---|
| a-1 | b-1 | r-1 | s-1 | d0 | d1 | d2 | a0 | b0 | r0 | s0 | E |
| 0 | 0 | 0 | 0 | 1 | — | — | 1 | 0 | 1 | 0 | 0 |
| 0 | 0 | 0 | 0 | 0 | — | — | 0 | 1 | 0 | 0 | 0 |
| 0 | 0 | 0 | 1 | 1 | 1 | — | 0 | 0 | 1 | 1 | 0 |
| 0 | 0 | 0 | 1 | 1 | 0 | 0 | 0 | 0 | 1 | 1 | 0 |
| 0 | 0 | 0 | 1 | 1 | 0 | 1 | 1 | 0 | 1 | 1 | 0 |
| 0 | 0 | 0 | 1 | 0 | — | — | | | | | 1 |
| 0 | 0 | 1 | 0 | 1 | — | — | 1 | 0 | 0 | 0 | 0 |
| 0 | 0 | 1 | 0 | 0 | — | — | 0 | 1 | 1 | 1 | 0 |
| 0 | 0 | 1 | 1 | 1 | — | — | 1 | 0 | 0 | 0 | 0 |
| 0 | 0 | 1 | 1 | 0 | 0 | — | 1 | 0 | 0 | 1 | 0 |
| 0 | 0 | 1 | 1 | 0 | 1 | — | | | | | 1 |
| 0 | 1 | 0 | 0 | 1 | — | — | 0 | 0 | 1 | 0 | 0 |
| 0 | 1 | 0 | 0 | 0 | — | — | 0 | 1 | 0 | 0 | 0 |
| 0 | 1 | 0 | 1 | — | — | — | | | | | 1 |
| 0 | 1 | 1 | 0 | 0 | — | — | 0 | 1 | 1 | 1 | 0 |
| 0 | 1 | 1 | 0 | 1 | — | — | | | | | 1 |
| 0 | 1 | 1 | 1 | 0 | 0 | — | 0 | 1 | 1 | 0 | 0 |
| 0 | 1 | 1 | 1 | 0 | 1 | — | 0 | 0 | 0 | 1 | 0 |
| 0 | 1 | 1 | 1 | 1 | — | — | 0 | 0 | 0 | 0 | 0 |
| 1 | 0 | 0 | 0 | 1 | — | — | 1 | 0 | 1 | 0 | 0 |
| 1 | 0 | 0 | 0 | 0 | — | — | 0 | 1 | 0 | 0 | 0 |
| 1 | 0 | 0 | 1 | — | — | — | 0 | 0 | 1 | 0 | 0 |
| 1 | 0 | 1 | 0 | 0 | — | — | 0 | 1 | 1 | 1 | 0 |
| 1 | 0 | 1 | 0 | 1 | — | — | 1 | 0 | 0 | 0 | 0 |
| 1 | 0 | 1 | 1 | 0 | 1 | — | 1 | 0 | 0 | 1 | 0 |
| 1 | 0 | 1 | 1 | 1 | — | — | | | | | 1 |
| 1 | 0 | 1 | 1 | 0 | 0 | — | | | | | 1 |
| 1 | 1 | — | — | — | — | — | | | | | 1 |

Truth Table For (5,3) Indirect Code Encoder

TABLE 18

| DECODED INPUTS | | | | OUTPUTS | | |
|---|---|---|---|---|---|---|
| a-1,b-1 | r-1,s-1 | d0,d1 | d2 | a0,b0 | $\overline{r0}$,s0 | $\overline{F}$ |
| 1101 | 0110 | 0010 | 01 | 10 | 00 | 0 |
| 0100 | 1011 | 1000 | 11 | 01 | 00 | 1 |
| 1111 | 0011 | 0011 | 11 | 00 | 10 | 0 |
| 1100 | 1011 | 1000 | 11 | 00 | 00 | 1 |
| 1101 | 0100 | 1111 | 11 | 00 | 01 | 0 |
| 0110 | 0001 | 0100 | 11 | 00 | 11 | 1 |
| 1011 | 0001 | 1100 | 11 | 10 | 11 | 0 |
| 1011 | 1011 | 0011 | 11 | 10 | 00 | 0 |
| 1010 | 1110 | 0011 | 11 | 00 | 00 | 1 |
| 1111 | 1000 | 1100 | 11 | 01 | 10 | 0 |
| 1100 | 0001 | 0011 | 11 | 00 | 10 | 1 |
| 0010 | 1110 | 1111 | 11 | 00 | 00 | 1 |
| 1110 | 0010 | 1100 | 11 | 01 | 01 | 1 |
| 1110 | 1000 | 1111 | 11 | 00 | 00 | 1 |

Array Logic For (5,3) Indirect Code Encoder

TABLE 19

| INPUTS | | | | | | | | | | | | OUTPUTS | |
|---|---|---|---|---|---|---|---|---|---|---|---|---|---|
| a-2 | b-2 | a-1 | b-1 | a0 | b0 | a1 | b1 | a2 | b2 | a3 | b3 | d0 | E |
| — | — | 0 | 0 | 0 | 0 | 0 | 0 | — | — | — | — | 1 | 1 |
| — | — | 0 | 1 | 0 | 0 | 0 | 0 | — | — | — | — | 0 | 1 |
| — | — | 0 | 1 | 0 | 0 | 1 | 0 | 1 | 0 | 0 | 0 | 0 | 1 |
| — | — | 0 | 1 | 0 | 0 | — | 1 | — | — | — | — | 1 | 1 |
| — | — | 0 | 1 | 0 | 0 | 1 | — | 0 | — | — | — | 1 | 1 |

TABLE 19-continued

| INPUTS | | | | | | | | | | | | OUTPUTS | |
|---|---|---|---|---|---|---|---|---|---|---|---|---|---|
| a-2 | b-2 | a-1 | b-1 | a0 | b0 | a1 | b1 | a2 | b2 | a3 | b3 | d0 | E |
| — | — | 0 | 1 | 0 | 0 | 1 | — | — | 1 | — | — | 1 | 1 |
| — | — | 0 | 1 | 0 | 0 | 1 | — | — | — | 1 | — | 1 | 1 |
| — | — | 0 | 1 | 0 | 0 | 1 | — | — | — | — | 1 | 1 | 1 |
| 0 | 0 | 1 | 0 | 0 | 0 | — | — | — | — | — | — | 0 | 1 |
| 1 | 0 | 1 | 0 | 0 | 0 | — | — | — | — | — | — | 1 | 1 |
| — | — | — | — | 0 | 1 | — | — | — | — | — | — | 0 | 1 |
| — | — | — | — | 1 | 0 | 0 | 0 | — | — | — | — | 0 | 1 |
| — | — | — | — | 1 | 0 | 1 | — | — | — | — | — | 1 | 1 |
| — | — | — | — | 1 | 0 | — | 1 | — | — | — | — | 1 | 1 |

Truth Table For (5,3) Indirect Code Decoder

TABLE 20

| INPUTS | | | | | | OUTPUTS | |
|---|---|---|---|---|---|---|---|
| a-2,b-2 | a-1,b-1 | a0,b0 | a1,b1 | a2,b2 | a3,b3 | $\overline{d0}$ | E |
| 1111 | 1101 | 1101 | 0010 | 0010 | 1000 | 1 | 0 |
| 1111 | 0001 | 1001 | 1111 | 1111 | 1111 | 1 | 1 |
| 1101 | 0011 | 1101 | 1111 | 1111 | 1111 | 1 | 0 |
| 1111 | 1111 | 0111 | 1000 | 1111 | 1111 | 1 | 0 |
| 0101 | 0011 | 1001 | 1111 | 1111 | 1111 | 1 | 1 |
| 1111 | 0101 | 1111 | 1000 | 1111 | 1111 | 1 | 0 |
| 1111 | 1111 | 0001 | 1111 | 1111 | 1111 | 0 | 1 |
| 1111 | 1001 | 1001 | 0111 | 1111 | 1111 | 1 | 1 |
| 1111 | 1111 | 0101 | 1111 | 1111 | 1111 | 1 | 0 |

Array Logic For (5,3) Indirect Code Decoder

What is claimed is:

1. An encoder for encoding a data bit as a pair of code bits according to a (5,3) indirect code, comprising, means providing a data bit to be encoded and the next two data bits, means responsive to said data bit to be encoded, to said next two data bits, to two bits for identifying the existing state of the encoding operation, and to the preceding pair of code bits for producing a next pair of code bits and the next two bits identifying the resulting encoding state, and means responsive to said pair of code bits and to said next bits for identifying the resulting encoding state to form said bits identifying the state of the encoding operation and said preceding code bits for encoding the next of said data bits.

2. The encoder of claim 1 wherein said means for producing said pair of code bits further includes means producing an error signal identifying invalid combinations of said data bits and state identifying bits.

3. The encoder of claim 2 wherein said means for producing said code bits, said state identifying bits and said error signal comprises a logic array constructed according to Table 17.

4. A decoder for a (5,3) indirect code, in which a code bit pair represents a data bit comprising, means for providing code bit pairs for a bit to be decoded, the two preceding data bits, and the next two data bits, logic means for decoding said bit to be decoded according to said code bit pairs, and means connecting said logic means to receive said code bit pairs.

5. A decoder for a (4,3) indirect code in which a code bit pair represents a data bit, comprising, means for storing a three bit signal identifying the existing state of the decoding operation, means providing a code bit pair for the data bit to be decoded, and logic means for decoding said bit to be decoded according to said code bits and said three bits identifying the encoding state and for producing three code bits defining the resulting state of the encoding operation.

6. A zero modulation encoder, comprising, means providing a data bit to be encoded and a plurality of adjacent data bits, said bits appearing as any one of $2^{n+1}$ combinations, where n is the number of adjacent bits, a plurality of logic means each connected to receive the data bit to be encoded, the adjacent data bits, and a signal for identifying the existing state of the encoding operation, and each having means for producing a code bit pair and a signal for identifying the resulting state of the encoding operation, said plurality of logic means including, first logic means operable in a first encoding state for encoding a data bit in a first binary fraction of said combinations as a code bit pair and producing a signal for identifying a second coding state, second logic means operable in said first encoding state for encoding a data bit in a second binary fraction of said combinations as a different code bit pair and producing a signal for identifying a third coding state, third logic means operable in said first encoding state for encoding a data bit in a remaining binary fraction of said combinations as a code bit pair and producing a signal for identifying a fourth coding state and additional logic means operable in other encoding states for encoding a data bit of a binary fraction of said combinations as a code bit pair and producing a signal for identifying a next coding state for operating in an (R, C) code, where R is a run length in the range 4–6 and C is a charge constraint equal to 3.

7. A zero modulation encoder, comprising, means providing a data bit to be encoded and the next two adjacent data bits, said bits appearing as any one of eight combinations, a plurality of logic means each connected to receive the data bit to be encoded, the adjacent data bits, and a signal for identifying the existing state of the encoding operation, and each having means for producing a code bit pair and a signal for identifying the resulting state of the encoding operation, said plurality of logic means including, first logic means operable in a first encoding state for encoding a data bit in a first binary fraction of said combinations as a code bit pair and producing a signal for identifying a second coding state, second logic means operable in said first encoding state for encoding a data bit in a second binary fraction of said combinations as a different code bit pair and producing a signal for identifying a third coding state, third logic means operable in said first encoding state for encoding a data bit in a remaining binary fraction of said combinations as a code bit pair and producing a signal for identifying a fourth coding state, and additional logic means for providing eight encoding states for operating in a (4,3) code.

8. The zero modulation encoder of claim 7 wherein each of said means for providing a signal for identifying the resulting encoding state comprises means for providing a three bit code.

9. A zero modulation encoder, comprising, means providing a data bit to be encoded and the next two adjacent data bits, said bits appearing as any one eight combinations, a plurality of logic means each connected to receive the data bit to be encoded, the adjacent data bits, and a signal for identifying the existing state of the encoding operation, and each having means for producing a code bit pair and a signal for identifying the resulting state of the encoding operation, said plurality of logic means including, first logic means operable in a first encoding state for encoding a data bit in a first binary fraction of said combinations as a code bit pair and producing a signal for identifying a second coding state, second logic means operable in said first encoding state for encoding a data bit in a second binary fraction of said combinations as a different code bit pair and producing a signal for identifying a third coding state, third logic means operable in said first encoding state for encoding a data bit in a remaining binary fraction of said combinations as a code bit pair and producing a signal for identifying a fourth coding state, and additional logic means for providing at least nine encoding states for operating in a (4,3) code.

10. The zero modulation encoder of claim 9 wherein each of said means for providing said signal for identifying the resulting encoding state comrpises, means for providing a three bit signal and said encoder further includes means for storing said code bit pairs from one encoding operation and supplying said code bit pair to said plurality of logic means on a next encoding operation to further identify one of said nine states.

* * * * *